(12) United States Patent
Okazaki et al.

(10) Patent No.: US 9,575,389 B2
(45) Date of Patent: Feb. 21, 2017

(54) LIGHT MODULATOR AND EXPOSURE HEAD

(71) Applicants: DAINIPPON SCREEN MFG. CO., LTD., Kyoto-shi, Kyoto (JP); OSAKA UNIVERSITY, Osaka (JP)

(72) Inventors: Masahide Okazaki, Kyoto (JP); Toshiaki Suhara, Osaka (JP)

(73) Assignees: Screen Holdings Co., Ltd., Kyoto (JP); Osaka University, Osaka (JP)

( * ) Notice: Subject to any disclaimer, the term of this patent is extended or adjusted under 35 U.S.C. 154(b) by 192 days.

(21) Appl. No.: 14/478,982

(22) Filed: Sep. 5, 2014

(65) Prior Publication Data
US 2015/0070676 A1 Mar. 12, 2015

(30) Foreign Application Priority Data
Sep. 6, 2013 (JP) ................................. 2013-185223

(51) Int. Cl.
  G03F 7/20 (2006.01)
  G02F 1/29 (2006.01)
  G02F 1/31 (2006.01)
(52) U.S. Cl.
  CPC ........... *G02F 1/292* (2013.01); *G03F 7/70191* (2013.01); *G02F 2001/311* (2013.01);
  (Continued)
(58) Field of Classification Search
  None
  See application file for complete search history.

(56) References Cited

U.S. PATENT DOCUMENTS

| 6,570,684 B1 | 5/2003 | Stone et al. |
| 2002/0102048 A1* | 8/2002 | Yamada ................ G02F 1/0508 385/22 |

(Continued)

FOREIGN PATENT DOCUMENTS

| CN | 101377601 A | 3/2009 |
| CN | 102360130 A | 2/2012 |

(Continued)

OTHER PUBLICATIONS

Korean Notice of Allowance issued in Application No. 10-2014-0085075 dated Dec. 28, 2015.

(Continued)

*Primary Examiner* — Steven H Whitesell Gordon
(74) *Attorney, Agent, or Firm* — McDermott Will & Emery LLP

(57) ABSTRACT

A first electro-optic crystal substrate and a second electro-optic crystal substrate are provided as an electro-optic crystal substrate. The first electro-optic crystal substrate comprises a first periodic polarization reversal structure in which first polarization pairs, in each of which the directions of polarization in response to electric fields are opposite to each other, are arranged in a first period along a first arrangement direction which is orthogonal or inclined with respect to the direction of propagation, and light passes through the first periodic polarization reversal structure. The second electro-optic crystal substrate comprises a second periodic polarization reversal structure in which second polarization pairs, in each of which the directions of polarization in response to electric fields are opposite to each other, are arranged in a second period along a second arrangement direction which is orthogonal or inclined with respect to the direction of propagation, and light outstanding from the first electro-optic crystal substrate passes through the second periodic polarization reversal structure. At least (Continued)

one of a first condition and a second condition is satisfied. The first condition is that the first and the second periods are different from each other and a second condition is that the first arrangement direction and the second arrangement direction are different from each other.

19 Claims, 17 Drawing Sheets

(52) U.S. Cl.
CPC .... *G02F 2201/16* (2013.01); *G02F 2201/305* (2013.01); *G02F 2201/307* (2013.01)

(56) References Cited

U.S. PATENT DOCUMENTS

| | | | |
|---|---|---|---|
| 2003/0030885 A1* | 2/2003 | Oh | G02F 1/292 359/301 |
| 2003/0133643 A1* | 7/2003 | Oh | G02F 1/31 385/16 |
| 2004/0114913 A1* | 6/2004 | Kume | G11B 9/02 386/361 |
| 2005/0002101 A1 | 1/2005 | Kim et al. | |
| 2007/0298334 A1* | 12/2007 | Chen | G03F 7/70408 430/11 |
| 2009/0040596 A1 | 2/2009 | Mizuuchi et al. | |
| 2009/0268271 A1* | 10/2009 | Reynolds | G02B 26/002 359/263 |
| 2010/0166356 A1* | 7/2010 | Okazaki | G02F 1/292 385/8 |
| 2012/0182535 A1* | 7/2012 | Okazaki | G02F 1/2955 355/67 |

FOREIGN PATENT DOCUMENTS

| | | | |
|---|---|---|---|
| EP | 2477069 A1 | 7/2012 | |
| JP | WO 2009004936 A1 * | 1/2009 | ........... G02F 1/0316 |
| JP | 2010-152214 A | 7/2010 | |
| JP | 2011-039415 A | 2/2011 | |
| JP | 2013-164614 A | 8/2013 | |
| WO | 2006/112303 A1 | 10/2006 | |
| WO | 2008/032061 A2 | 3/2008 | |

OTHER PUBLICATIONS

T. Inoue et al., "Electrooptic Bragg Deflection Modulator Using Periodically Poled MgO:LiNbO3," IEEE Photonics Technology Letters, vol. 23, No. 17, Sep. 1, 2011, pp. 1252-1254.

K. Koyanagi, "Multi-Phase-Level Electro-Optical Beam Deflector in Combined Periodic Polarization-Reversed Structures with Different Thickness," Electronics and Communications in Japan, Part 2, vol. 87, No. 9, 2004, pp. 12-21 (Translated from Denshi Joho Tsushin Gakkai Ronbunshi, vol. J87-C, No. 2, Feb. 2004, pp. 242-250).

Extended European Search Report issued in European Application No. 14 18 1062 dated Dec. 18, 2014, 10 pgs.

Chinese Office Action issued in Application No. 201410452775.2 dated Oct. 28, 2016.

* cited by examiner

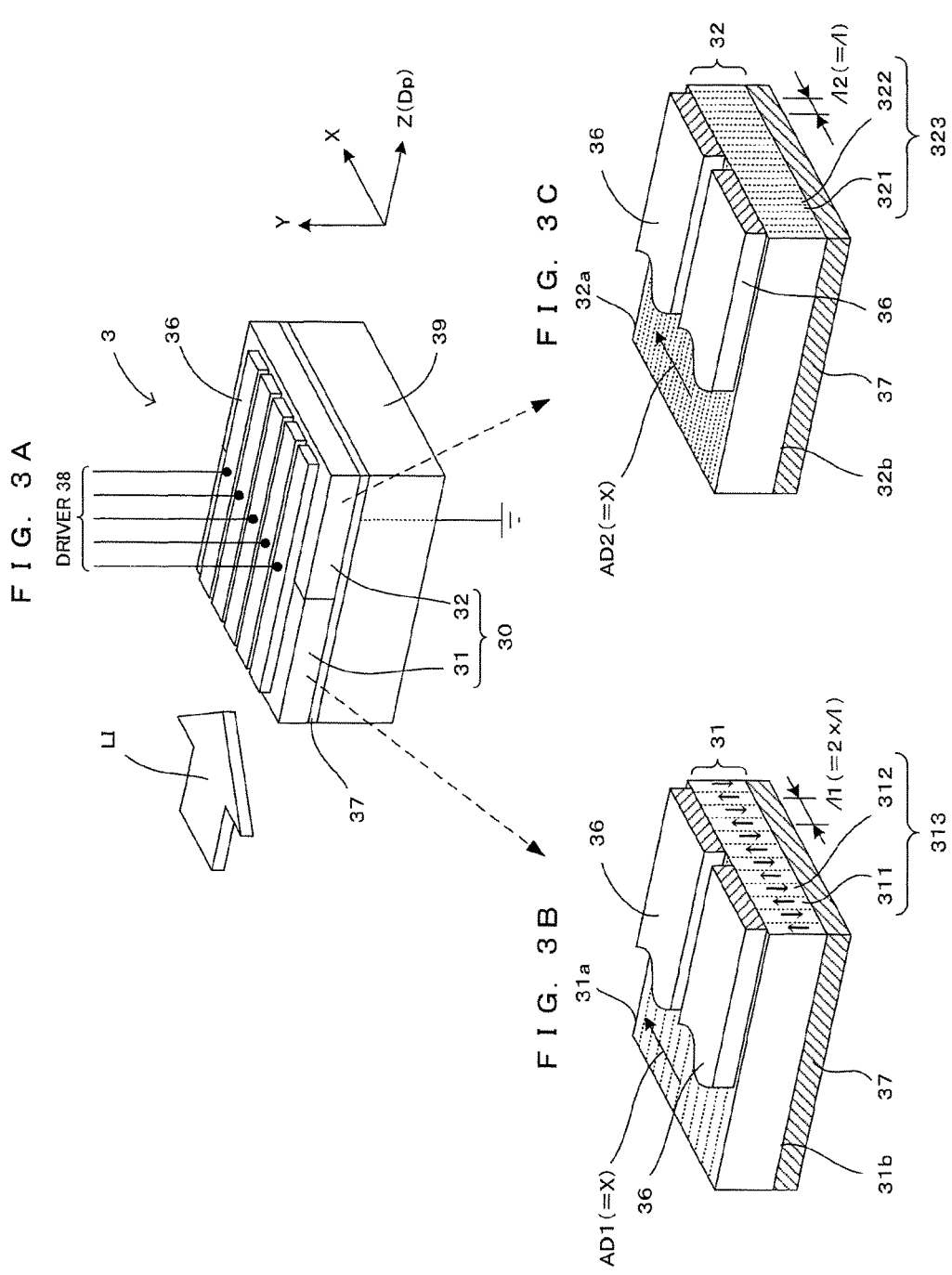

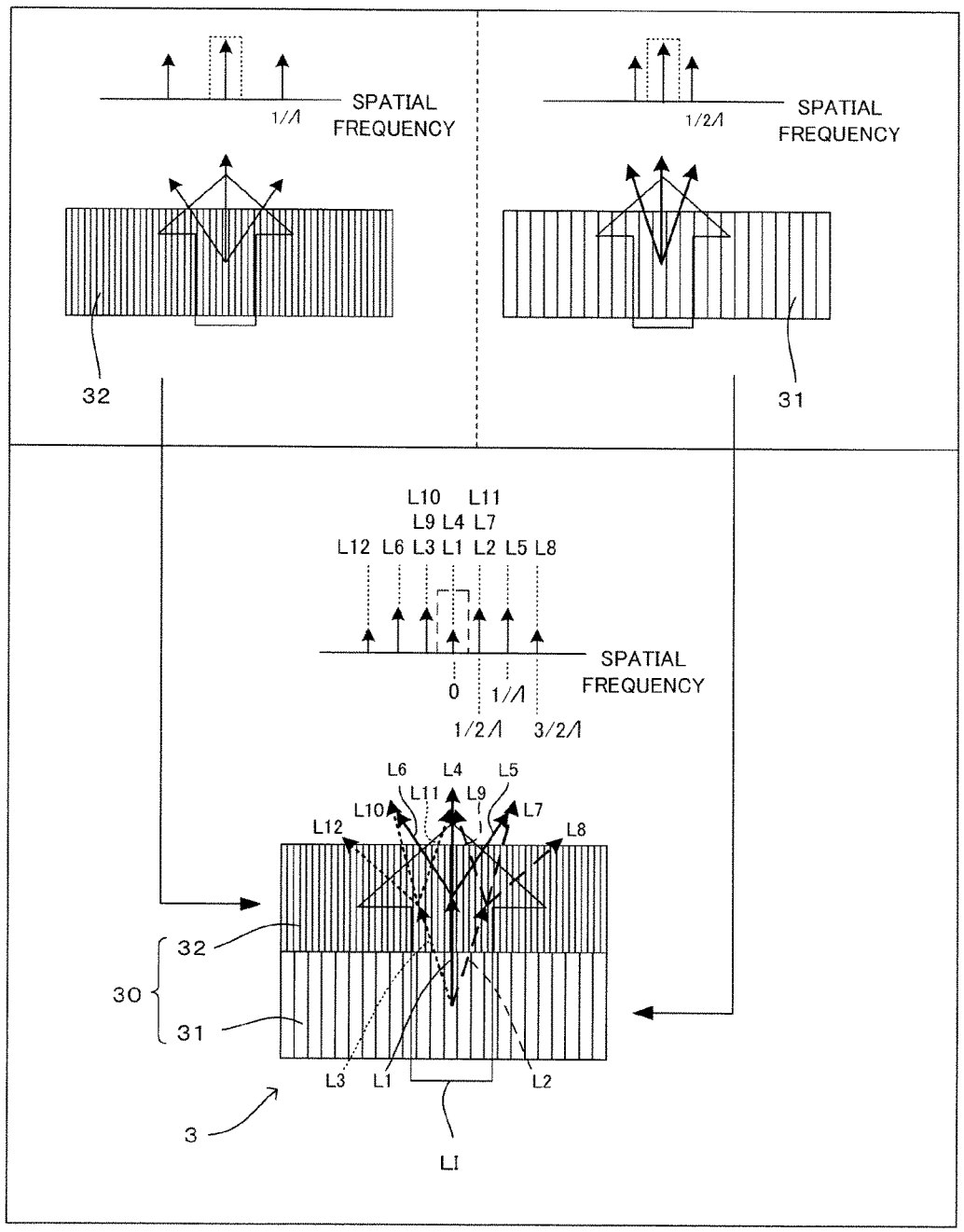

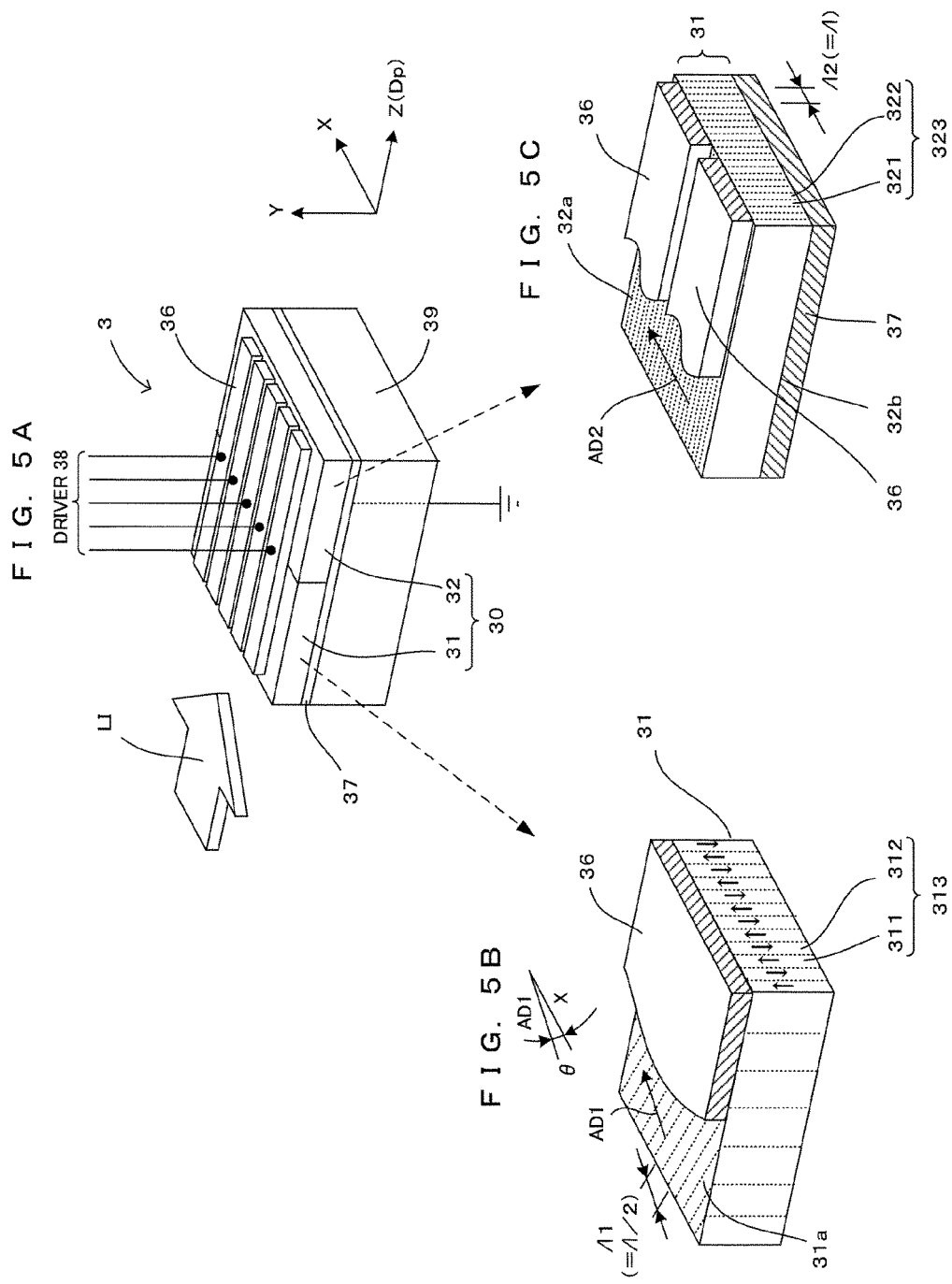

LIGHT MODULATOR AND EXPOSURE HEAD

CROSS REFERENCE TO RELATED APPLICATION

The disclosure of Japanese Patent Application No. 2013-185223 filed on Sep. 6, 2013 including specification, drawings and claims is incorporated herein by reference in its entirety.

BACKGROUND OF THE INVENTION

1. Field of the Invention

The invention is related to a technique for improving the extinction ratio of a light modulator which modulates light passing through by an electro-optic crystal substrate.

2. Description of the Related Art

The index of refraction of an electro-optical crystal substrate formed using lithium niobate ($LiNbO_3$), lithium tantalite ($LiTaO_3$), etc. changes in accordance with a voltage which is applied from outside. Noting this, JP-A-2010-152214 proposes a light modulator which has a structure that a distribution of the index of refraction is generated inside an electro-optical crystal substrate in accordance with a voltage applied from outside and the distribution of the index of refraction functions as a diffraction grating so that light is modulated. In short, using the diffraction grating which is created inside the electro-optical crystal substrate in accordance with the applied voltage, the light modulator modulates light which is passing through the electro-optical crystal substrate.

SUMMARY OF THE INVENTION

By the way, one of the key technical elements concerning a light modulator is the extinction ratio. The extinction ratio means the degree of the intensity of 0-order light (non-diffracted light or transmitted light) as it is at the time of ON/OFF of the light modulator. How the extinction ratio would be improved has been a challenge from before. As described in detail later, even in the light modulator according to JP-A-2010-152214 mentioned above, it is possible to improve the extinction ratio by ensuring that the diffraction grating has an appropriate length (grating length) and the applied voltage is appropriate. However, the applied voltage needs be high while nevertheless staying within a practical voltage range for the light modulator to actually work and parallel light so shaped to have the angle of 0.1 degree or less with respect to the optical axis needs be used, among other restrictions. Further, even when a light modulator satisfying these restrictions is obtained according to the conventional techniques, the extinction ratio of the light modulator is not always adequate.

The invention has been made in light of the problems above, and accordingly, aims at providing a light modulator which exhibits an excellent extinction ratio and providing an exposure head which is capable of achieving favorable exposure using such a light modulator.

According to an first aspect of the invention, there is provided a light modulator which modulates light which propagates in a propagation direction, comprising: a first electro-optic crystal substrate that has a first periodic polarization reversal structure and lets the light through the first periodic polarization reversal structure in which first polarization pairs, in each of which the directions of polarization developing in response to electric fields are opposite to each other, are arranged in a first period along a first arrangement direction which is orthogonal or inclined with respect to the propagation direction; a second electro-optic crystal substrate that has a second periodic polarization reversal structure and lets the outgoing light from the first electro-optic crystal substrate through the second periodic polarization reversal structure in which second polarization pairs, in each of which the directions of polarization developing in response to electric fields are opposite to each other, are arranged in a second period along a second arrangement direction which is orthogonal or inclined with respect to the propagation direction; and a driver that applies a voltage upon the first electro-optic crystal substrate and the second electro-optic crystal substrate to create diffraction gratings inside the first periodic polarization reversal structure and the second periodic polarization reversal structure, thereby modulating the light, wherein at least one of a first condition and a second condition is satisfied, the first condition being that the first period and the second period are different from each other, the second condition being that the first arrangement direction and the second arrangement direction are different from each other.

According to an second aspect of the invention, there is provided an exposure head, comprising: an illumination optical system which irradiates light from a light source in a propagation direction; a light modulator which modulates the light irradiated from the illumination optical system; and a projection optical system which projects the modulated light from the modulator upon an area-to-be-exposed, wherein the light modulator comprises: a first electro-optic crystal substrate that has a first periodic polarization reversal structure and lets the light through the first periodic polarization reversal structure in which first polarization pairs, in each of which the directions of polarization developing in response to electric fields are opposite to each other, are arranged in a first period along a first arrangement direction which is orthogonal or inclined with respect to the propagation direction; a second electro-optic crystal substrate that has a second periodic polarization reversal structure and lets the outgoing light from the first electro-optic crystal substrate through the second periodic polarization reversal structure in which second polarization pairs, in each of which the directions of polarization developing in response to electric fields are opposite to each other, are arranged in a second period along a second arrangement direction which is orthogonal or inclined with respect to the propagation direction; and a driver that applies a voltage upon the first electro-optic crystal substrate and the second electro-optic crystal substrate to create diffraction gratings inside the first periodic polarization reversal structure and the second periodic polarization reversal structure, thereby modulating the light, wherein at least one of a first condition and a second condition is satisfied, the first condition being that the first period and the second period are different from each other, the second condition being that the first arrangement direction and the second arrangement direction are different from each other.

According to the invention, the first electro-optical crystal substrate and the second electro-optical crystal substrate are formed so as to satisfy at least one of the first condition and the second condition. Hence, as the voltage is applied upon the first electro-optical crystal substrate and the second electro-optical crystal substrate, different trends of diffraction are observed between the diffraction grating which is created within the first periodic polarization reversal structure of the first electro-optical crystal substrate and the diffraction grating which is created within the second periodic polarization reversal structure of the second electro-optical crystal substrate. Therefore, even if light modulation by the first electro-optical crystal substrate fails to sufficiently modulate incident light and allows the incident light to propagate as is and to pass through the first electro-optical crystal substrate, the second electro-optical crystal substrate modulates the passing light. This reduces the amount of residual light passing through both the first electro-optics crystal substrate and the second electro-optic crystal substrate without getting diffracted by any one of the first electro-optic crystal substrate and the second electro-optic crystal substrate when the voltage is applied, thereby attaining a high extinction ratio.

As described above, it is possible according to the invention to raise the extinction ratio of light modulation by the electro-optical crystal substrate. Further, applying the light modulator exhibiting such an excellent extinction ratio to the exposure head, exposure is achieved favorably.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIGS. 3A through 3C show the structure of the light modulator according to the first embodiment of the invention.

FIG. 4 is a schematic drawing of operations of the light modulator shown in FIGS. 3A through 3C.

FIGS. 5A through 5C are drawings which show the structure of the light modulator according to the second embodiment of the invention.

DETAILED DESCRIPTION OF THE PREFERRED EMBODIMENTS

Basic Structure of Exposure Head

Figure 1:
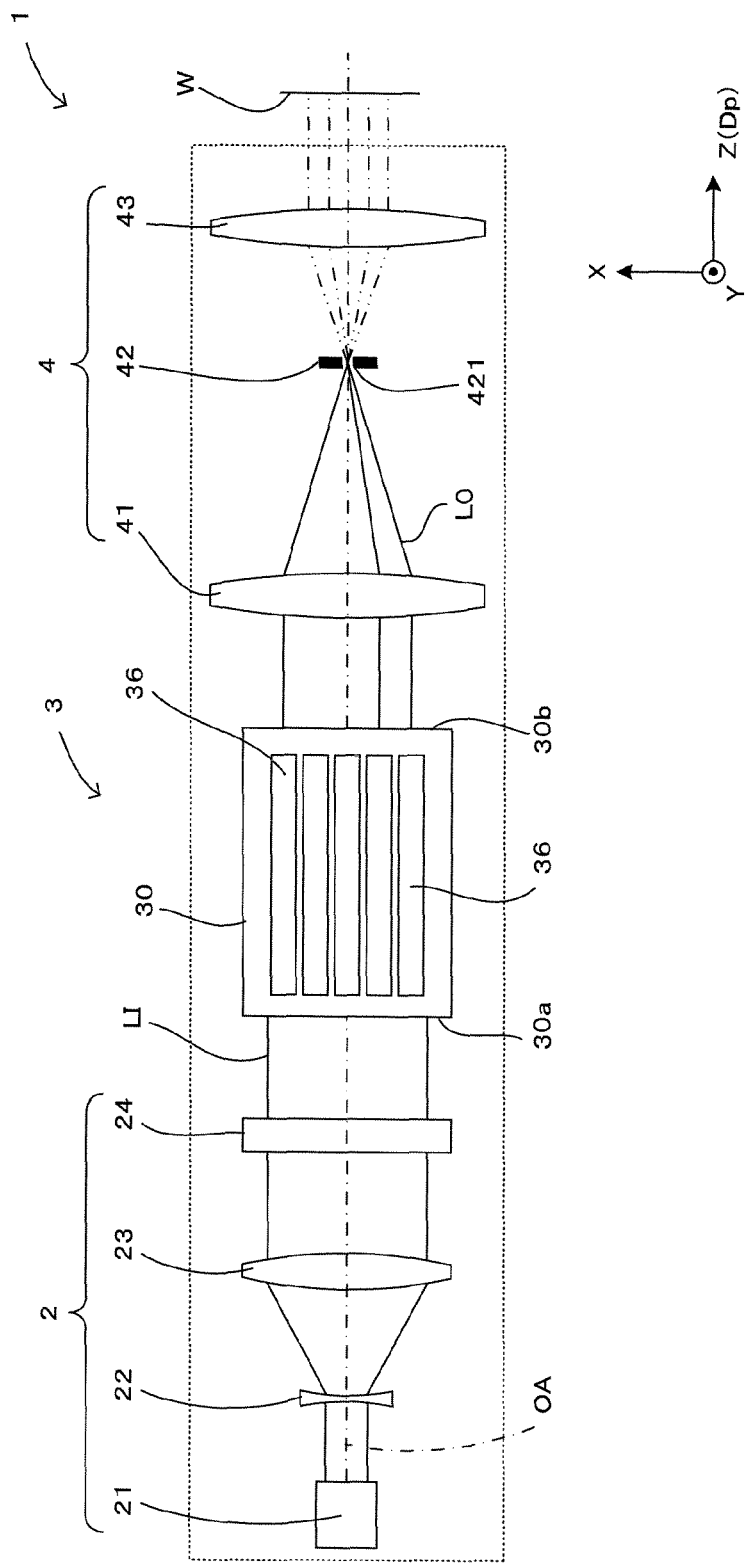
FIG. 1 is a drawing which shows an example of the basic structure of the exposure head according to the invention.

FIG. 1 is a drawing which shows an example of the basic structure of the exposure head according to the invention. The exposure head 1, equipped with a light modulator, irradiates light upon and accordingly exposes an area-to-be-exposed such as a substrate W. The exposure head 1 comprises an illumination optical system 2 which irradiates light from a light source 21 in a propagation direction Z, a light modulator 3 which modulates the light irradiated from the illumination optical system 2 and a projection optical system 4 which projects the modulated light by the light modulator 3 upon the substrate W (area-to-be-exposed).

The light source 21 of the illumination optical system 2 may be an ordinary laser light source with a Gaussian beam profile ($TEM_{00}$ fundamental transverse mode), a surface emitting light source, a light source in which a plurality of point light sources are arranged, or a laser array which has one-dimensional arrangement of semiconductor laser, etc. In the illumination optical system 2, light emitted from the light source 21 is incident to the light modulator 3 via three cylindrical lenses 22 through 24. Of these, the cylindrical lens 22 has negative power only in the direction X so that the cross sectional shape of a flux of light passing through the cylindrical lens 22 perpendicular to the optical axis OA gradually changes from a circular shape to an oval shape which is elongated in the direction X. In the direction Y which is perpendicular to the optical axis OA and the direction X, the width of a flux of light passing through the cylindrical lens 22 is (approximately) constant. Meanwhile, the cylindrical lens 23 has positive power only in the direction X and shapes light which has been passing through the cylindrical lens 22. That is, light passing through the cylindrical lens 23 is shaped to have an oval cross sectional shape which is elongated in the direction X and has a constant size and incident to the cylindrical lens 24. The cylindrical lens 24 has positive power only in the direction Y. Noting the direction Y alone, light LI passing through the cylindrical lens 24, while getting converged, is incident to a (−Z)-side edge surface (hereinafter "incident-side surface") 30a of an electro-optical crystal substrate 30 of the light modulator 3. Noting the direction X, the light LI passing through the cylindrical lens 24 is incident to the electro-optical crystal substrate 30 as parallel light.

As a voltage applied upon signal electrodes 36 from a driver not shown in FIG. 1 is adjusted, diffraction gratings are created within the electro-optic crystal substrate 30, whereby the light modulator 3 modulates light. In the exposure head 1 shown in FIG. 1, five signal electrodes 36 are provided in one principal surface of the electro-optic crystal substrate 30, and the signal electrodes receive the applied voltage from the driver independently of each other.

A common electrode (not shown) is provided in the other principal surface of the electro-optic crystal substrate 30 and grounded. Hence, inside the electro-optic crystal substrate 30, only at those areas which correspond to the signal electrodes 36 receiving the predetermined voltage (which is other voltage than 0 [V]) applied by the driver, electric fields developing between the signal electrodes 36 and the common electrode change the index of refraction according to the orientation of polarization, thereby creating diffraction gratings. As a result, light propagating through these areas gets diffracted by the electro-optic crystal substrate 30 and is emitted from the electro-optic crystal substrate 30 as diffracted light. Meanwhile, an electric field does not develop at those areas where the voltages is not applied upon the signal electrodes 36 and light propagating through these areas keeps propagating straight forward within the electro-optic crystal substrate 30 and is emitted from the electro-optic crystal substrate 30 as 0-order light (non-diffracted light). In this manner, as the applied voltage is controlled independently among the five signal electrodes 36, it is possible to modulate light of five channels.

In a projection optical system 4 disposed on the exit side (the right-hand side in FIG. 1) of the electro-optic crystal substrate 30, a lens 41, an aperture plate 42 and a lens 43 are disposed in this order. The front focus of the lens 41 is at the exit-side end 30b of the electro-optic crystal substrate 30, the aperture plate 42 is disposed at the back focus of the lens 41, and 0-order light Lo exiting from the exit-side end 30b of the electro-optic crystal substrate 30 so as to be parallel to the optical axis OA (the propagation direction Dp) goes through an aperture 421 of the aperture plate 42 and is incident to the lens 43. The front focus of the lens 43 is positioned at the aperture plate 42, the back focus of the lens 43 is set to be on the surface of the substrate W, and 0-order light Lo is irradiated upon the surface of the substrate W via the lens 43. On the other hand, diffracted light from the electro-optic crystal substrate 30 is emitted from the electro-optic crystal substrate 30 as it is inclined with respect to the optical axis OA, and therefore, the diffracted light cannot propagate through the aperture 421 and is blocked by the aperture plate 42. Only 0-order light Lo is thus irradiated upon the surface of the substrate W, thereby exposing the substrate W.

<Relationship Between Structure of Electro-Optic Crystal Substrate and Extinction Ratio>

Figure 2A:
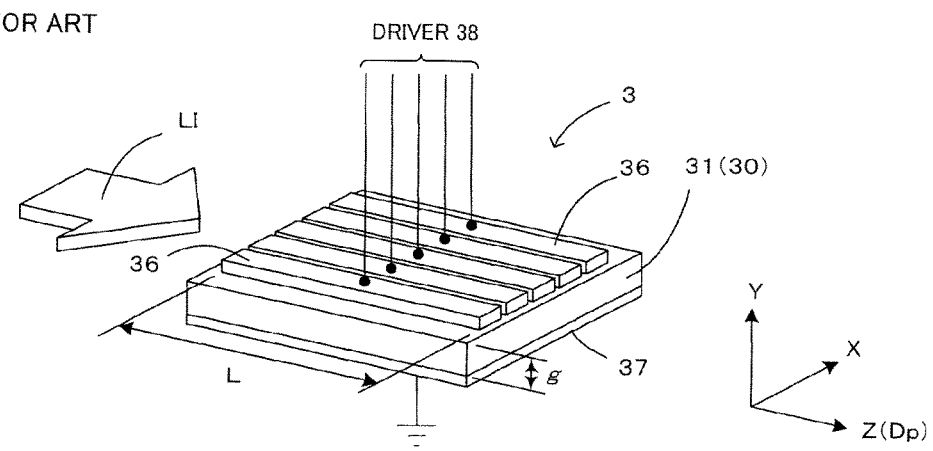
FIGS. 2A and 2B are drawings which schematically show the structure of a conventional light modulator.
Figure 2B:
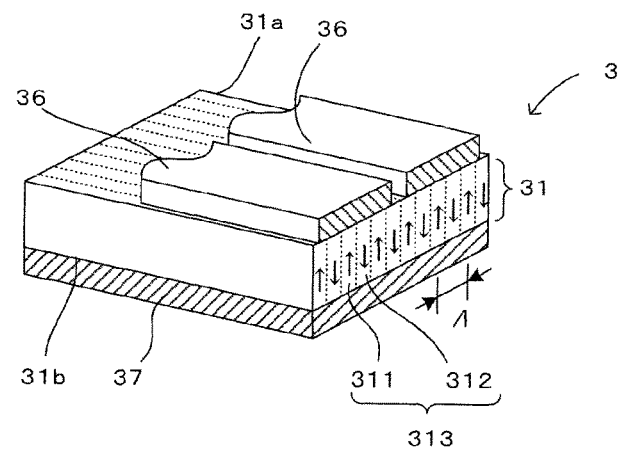

A description will now be given on an instance that the electro-optic crystal substrate 30 has the structure described in JP-A-2010-152214 (FIGS. 2A and 2B).

FIGS. 2A and 2B are drawings which schematically show the structure of a conventional light modulator, FIG. 2A is a perspective view of the light modulator 3 and FIG. 2B is a partially expanded view of the light modulator 3. The light modulator 3 comprises an electro-optic crystal substrate 31 which is shaped like a thin plate or slab, signal electrodes 36 which are disposed on the upper principal surface 31a of the electro-optic crystal substrate 31, a common electrode 37 which is disposed on the lower principal surface 31h of the electro-optic crystal substrate 31, and a driver 38 which applies a predetermined voltage upon each of the signal electrodes 36 independently. The electro-optic crystal substrate 31 is made of single crystals of lithium niobate (LiNbO₃ which is abbreviated as LN). In FIGS. 2A and 2B, the thickness of the electro-optic crystal substrate 31, i.e., the height in the direction Y, is denoted by the symbol g.

Within the electro-optic crystal substrate 31, first polarizing sections 311 and second polarizing sections 312, in which the directions of polarization caused by electric fields are opposite to each other, are alternately arranged and the electro-optic crystal substrate 31 has a periodic polarization reversal structure. In this embodiment, the first polarizing sections 311 and the second polarizing sections 312 are shaped like strips extending parallel to the propagation direction Dp and have the same width in the arrangement direction X which is orthogonal to the propagation direction Dp. Polarization pairs 313, each formed by the first polarizing section 311 and the second polarizing section 312 adjacent to each other, are arranged in a predetermined period (period Λ) along the arrangement direction X.

Further, in the electro-optic crystal substrate 31, the axes of crystals of the first and the second polarizing sections 311 and 312 are opposite to each other so that as electric potential differences are created between the signal electrodes 36 and the common electrode 37 and electric fields develop within a periodic polarization reversal structure, the directions of polarization which develop in the presence of the electric fields are opposite to each other. Instead of LN described above, lithium tantalite (LiTaO₃: LT) may be used for the electro-optic crystal substrate 31, etc. The axes of crystals of these materials are along the Y-axis direction in which the Pockels constant (electro-optic constant) $r_{33}$ takes a large value along the direction of polarization reversal (the orientation in which electric fields are applied).

In case of the light modulator 3 having the above structure, the trend of diffraction created within the periodic polarization reversal structure in response to voltage application can be classified according to the value of Q parameter which is indicative of the relative thickness of the grating (Formula (1)).

$$Q=2\pi\lambda L/n_e\Lambda^2 \qquad \text{[Formula 1]}$$

The symbol Λ denotes the period of polarization reversal (the period of the polarization pairs), the symbol L denotes the thickness of the grating (FIG. 2A), the symbol λ denotes the wavelength of incident light LI, and the symbol $n_e$ denotes the extraordinary refractive index of crystals with respect to incident light. Depending upon the value Q which is calculated using Formula 1, the trend of diffraction changes as follows:

when Q<1, Raman-Nath diffraction; and when Q>10, Bragg diffraction.

The q-order diffraction efficiency $\eta_q$ of Raman-Nath diffraction is yielded from Formula (2), while the diffraction efficiency η of Bragg diffraction (basic order) is yielded from Formula (3).

$$\eta_q=\{J_q(2\kappa L)\}^2 \qquad \text{[Formula 2]}$$

$$\eta=\sin^2(\kappa L) \qquad \text{[Formula 3]}$$

$$\kappa=\pi\Delta n_e/\lambda \qquad \text{[Formula 4]}$$

In these formulae, $J_q$ denotes the q-order Bessel function, $\Delta n_e$ denotes the amplitude of periodic changes of the index of refraction occurring inside crystals, V denotes the voltage applied upon the signal electrodes 36 (the electric potential differences between the signal electrodes 36 and the common electrode 37), and $r_{33}$ denotes the Pockels constant (References: Hiroshi Nishihara, Masamitsu Haruna and Toshiaki Suhara, "Optical Integrated Circuits," the revised and enlarged edition (Ohmsha, Tokyo, 1994), pp. 79-88 or H. Nishihara, M. Haruna and T. Suhara, "Optical Integrated Circuits," (McGraw-Hill, New York, 1989), pp. 77-83). The amplitude $\Delta n_e$ is given by Formula (5) below (Reference: M. Okazaki, T. Chichibu, S. Yoshimoto, T. Inoue and T. Suhara, IEEE PHOTONICS TECHNOLOGY LETTERS, Vol. 23, No. 22, Nov. 15, 2011, pp. 1709-1711).

[Formula 5]

$$\Delta n_e = -\frac{2}{\pi} n_e^3 r_{33} \left(\frac{V}{g}\right) \quad (5)$$

A description will now be given on a design which realizes Q=0.1 when the period of reverse poling Λ is 20 [μm], for the purpose of obtaining a spatial light modulator of the Raman-Nath diffraction type which utilizes 0-order light, in the case of the wavelength λ of the light LI=0.8 [μm], the inter-electrode distance g=50 [μm] and Y-cut LN crystals (in which the voltage is applied upon the Y-axis). For the purpose of this, calculation is performed under the condition that $n_e$=2.2 and $r_{33}$=3.6×10$^{-11}$ [m/V]. Calculating the grating thickness L from Formula (1), L=18 [μm] is obtained.

The maximum applied voltage is then calculated. A condition under which the maximum extinction ratio is obtained at 0-order light can be identified by a formula below theoretically from Formula (2).

$$\kappa L = 1.2 \quad \text{[Formula 6]}$$

Further, the maximum applied voltage V can be calculated from Formulae (4) through (6).

[Formula 7]

$$V = |-(1.2\lambda g)/(2n_e^3 r_{33} L)| \quad (7)$$
$$= |-(1.2 \cdot 0.8 \ \mu m \cdot 50 \ \mu m)/(2 \cdot 2.2^3 \cdot 3.6 \cdot 10^{-5} \mu m/V \cdot 18 \ \mu m)|$$
$$= 3.5 \times 10^3 \ V$$

As seen from such analysis, for the purpose of obtaining a high extinction ratio by the light modulator 3 shown in FIGS. 2A and 2B, the drive voltage to be applied upon the signal electrodes 36 must be as high as 3500 [V] which is beyond the withstand voltage of the electro-optic crystal substrate 31. In the exposure head 1 comprising the light modulator 3 shown in FIGS. 2A and 2B, the modulator 3 functions as a spatial modulator and the plurality of channels are modulated in parallel. Hence, an electric circuit (not shown) disposed within the driver 38 for applying the drive voltage has to be large. Attaining a high extinction ratio using the light modulator 3 shown in FIGS. 2A and 2B is therefore practically difficult.

Light modulation at about a few hundred [kHz] is required generally for the exposure head 1, and a voltage which can be applied upon the electro-optic crystal substrate 31 is at most approximately 100 [V]. Consideration will now be given upon driving of the light modulator 3 shown in FIGS. 2A and 2B at a voltage around 100 [V]. As Formula (7) clearly shows, it is desirable to shorten the inter-electrode distance g or extend the grating length L in order to reduce the applied voltage. Of these approaches, shortening of the inter-electrode distance g is not appropriate since the inter-electrode distance g is already as short as 50 [μm] and an attempt to further shorten the inter-electrode distance g will reduce the cross sectional area for propagation of light, increase the optical energy density and make propagation of high-power light impossible.

The approach to extend the grating length L will then be discussed next. When Formulae (4) through (6) are developed into a formula for yielding the grating length L, the following is obtained:

$$L = |-(1.2\lambda g)/(2n_e^3 r_{33} V)| \quad \text{[Formula 8]}$$

As the settings for the light modulator 3 above are substituted, it is necessary to set the grating length L at 630 [μm] if the light modulator 3 shown in FIGS. 2A and 2B is to be driven at 100 [V]. When the settings below for the light modulator 3, namely, λ=800 [nm], L=630 [μm], $n_e$=2.2 and Λ=20 [μm] are substituted into Formula (1) and the result of calculation is Q≈3.6. This means that diffraction achieved by the electro-optic crystal substrate 31 which is configured according to these settings above is in a zone between Raman-Nath diffraction and Bragg diffraction. This does not agree with Formula (2) which is indicative of Raman-Nath diffraction, and cannot theoretically yield the efficiency of diffraction.

Simulation of extinction by the light modulator 3 will now be described. More specifically describing, BPM (Beam Propagation Method) is used as for behaviors of light inside the crystal substrate 31. From the exit-side end of the electro-optic crystal substrate 31 to the substrate W, the complex amplitude of light as it exits the electro-optic crystal substrate 31 is Fourier-transformed, and a spatial filter is then added at the location of the aperture 421, followed by inverse Fourier transformation, thereby yielding the complex amplitude at the substrate W and simulating the situation of extinction. Although extinction becomes maximum in the vicinity of L=440 [μm] with application of V=100 [V] upon the signal electrodes 36 according to the simulation, the amount of residual light is as large as nearly 40 [%], which is hardly practical.

In addition, as seen from the analysis above, as the grating length L increases, the value Q grows, thereby making diffraction become closer to Bragg diffraction. Bragg diffraction thus becomes advantageous as diffraction to use. However, in general, to use Bragg diffraction, it is necessary to set such that an incident ray contained in the incident light LI is highly parallel to the optical axis OA. e.g., the ray is at the angle of 0.1 degree or smaller with respect to the optical axis OA. For this purpose, a laser source of TEM$_{00}$ fundamental transverse mode which is ideal as a light source needs be used. Even with this configuration, it has still been difficult to achieve a high extinction ratio.

The inventors of the invention performed various experiments and simulations and obtained the following findings. That is, it is possible to obtain a light modulator having a high extinction ratio when two or more types of electro-optic crystal substrates are combined with each other instead of forming the electro-optic crystal substrate 30 using the single electro-optic crystal substrate 31 as that shown in FIGS. 2A and 2B. Now, embodiments of a light modulator with a high extinction ratio which is formed by combining two or more types of electro-optic crystal substrates will be described.

First Embodiment

FIGS. 3A through 3C show the structure of the light modulator according to the first embodiment of the invention. FIG. 3A is a perspective view of the light modulator 3. FIG. 3B is a partially enlarged perspective view which shows a structure of former part (i.e., a first electro-optic crystal substrate 31) and FIG. 3C is a partially enlarged perspective view which shows a structure of latter part (i.e., a second electro-optic crystal substrate 32). FIG. 4 is a schematic drawing of operations of the light modulator shown in FIGS. 3A through 3C. In the first embodiment, as the electro-optic crystal substrate 30, the two types of electro-optic crystal substrates 31 and 32 are disposed in a series arrangement to each other on a hold plate 39 in the propagation direction Dp (Z-direction). The electro-optic crystal substrates 31 and 32 in principle have the same structure except that they have different periods.

The electro-optic crystal substrate 31 is shaped like a thin plate or slab and made of LN single crystals. Like the electro-optic crystal substrate 31 shown in FIGS. 2A and 2B, inside this electro-optic crystal substrate 31, polarization pairs 313 comprised of first polarizing sections 311 and second polarizing sections 312 are arranged in a period $\Lambda 1$ along a first arrangement direction AD1 (which is the direction X in this embodiment), whereby a periodic polarization reversal structure is achieved.

Another electro-optic crystal substrate 32, like the electro-optic crystal substrate 31, is similarly shaped like a thin plate or slab and made of LN single crystals. The internal structure of the electro-optic crystal substrate 32 is the same as that of the electro-optic crystal substrate 31 except for different periods. In other words, inside the electro-optic crystal substrate 32, first polarizing sections 321 and second polarizing sections 322, which polarize in the opposite directions to each other when applied with electric fields, are arranged alternately with each other. The first polarizing sections 311 and the second polarizing sections 312 are all shaped like strips which extend parallel to the propagation direction Dp, and have the same width along the arrangement direction X which is orthogonal to the propagation direction Dp. Polarization pairs 323 comprised of the first polarizing sections 321 and the second polarizing sections 322 are arranged along a second arrangement direction AD2 (which is the direction X in this embodiment) in a shorter period $\Lambda 2$ than in the electro-optic crystal substrate 31. The electro-optic crystal substrate 32 thus has what is known as a periodic polarization reversal structure.

In this embodiment, as described above, the arrangement direction AD1 of the polarization pairs 313 (the first arrangement direction) and the arrangement direction AD2 of the polarization pairs 323 (the second arrangement direction) are both along the direction X and match with each other. In contrast, the periods are different between the electro-optic crystal substrate 31 and the electro-optic crystal substrate 32. To be more specific, the period $\Lambda 1$ of the electro-optic crystal substrate 31 is double the reference period $\Lambda$, whereas the period $\Lambda 2$ of the electro-optic crystal substrate 32 is same size as (equal to) the reference period $\Lambda$. In short, the period $\Lambda 1$ is double the period $\Lambda 2$.

As described above, the electro-optic crystal substrate 30 is formed as the electro-optic crystal substrates 31 and 32 in which the trends of diffraction are different from each other are arranged in this order in a series arrangement along the propagation direction Dp in such a manner that the (+Z)-side edge surface of the electro-optic crystal substrate 31 and the (−Z)-side edge surface of the electro-optic crystal substrate 32 are tightly adhered to each other or separated from each other over a very small distance while staying faced with each other. Hence, the light LI incident upon the (−Z)-side edge surface of the electro-optic crystal substrate 31 is passing through the electro-optic crystal substrates 31 and 32 and exits from the (+Z)-side edge surface of the electro-optic crystal substrate 32. These features remain similar in the other embodiments described later.

The common electrode 37 is disposed to the (−Y)-side principal surface of the electro-optic crystal substrate 30 (=31+32), namely, the back surface, and the electro-optic crystal substrate 30 is joined with the hold plate 39 via the common electrode 37. The hold plate 39 is thicker than the thickness of the electro-optic crystal substrate 30 (the inter-electrode distance g) and firmly holds the electro-optic crystal substrate 30 which has the thickness of merely 5 [μm] through tens of [μm], thereby enhancing the mechanical strength of the light modulator 3.

On the (+Y)-side principal surface of the electro-optic crystal substrate 30 (=31+32), namely, the front surface, the plurality of signal electrodes 36 (five signal electrodes 36 in this embodiment) which are across the electro-optic crystal substrates 31 and 32 in the propagation direction Dp are disposed, thereby sandwiching the electro-optic crystal substrates 31 and 32 with the common electrode 37. In this embodiment, each signal electrodes 36 has the electrode width larger than the period $\Lambda 1$ along the direction X, and is in contact with at least one or more of the polarization pairs 313 and 323 in any of the electro-optic crystal substrates 31 and 32. These features remain similar in the second through the sixth embodiments described later.

Further, the electro-optic crystal substrates 31 and 32 have the same thickness, and there is not any step at the boundary between the substrates 31 and 32. Hence, it is possible to form both the common electrode 37, which is across the back surfaces of the electro-optic crystal substrates 31 and 32, and the signal electrodes 36, which are across the front surfaces of the electro-optic crystal substrates 31 and 32, without bending them at the boundary between the electro-optic crystal substrates 31 and 32. The signal electrodes 36 provide the applied voltage from the driver 38 to the electro-optic crystal substrates 31 and 32, thereby creating distributions of index of refraction which function as diffraction gratings inside the electro-optic crystal substrates 31 and 32. This makes it possible to realize Raman-Nath light modulation of five channels in each one of the substrates 31 and 32.

Figure 6:
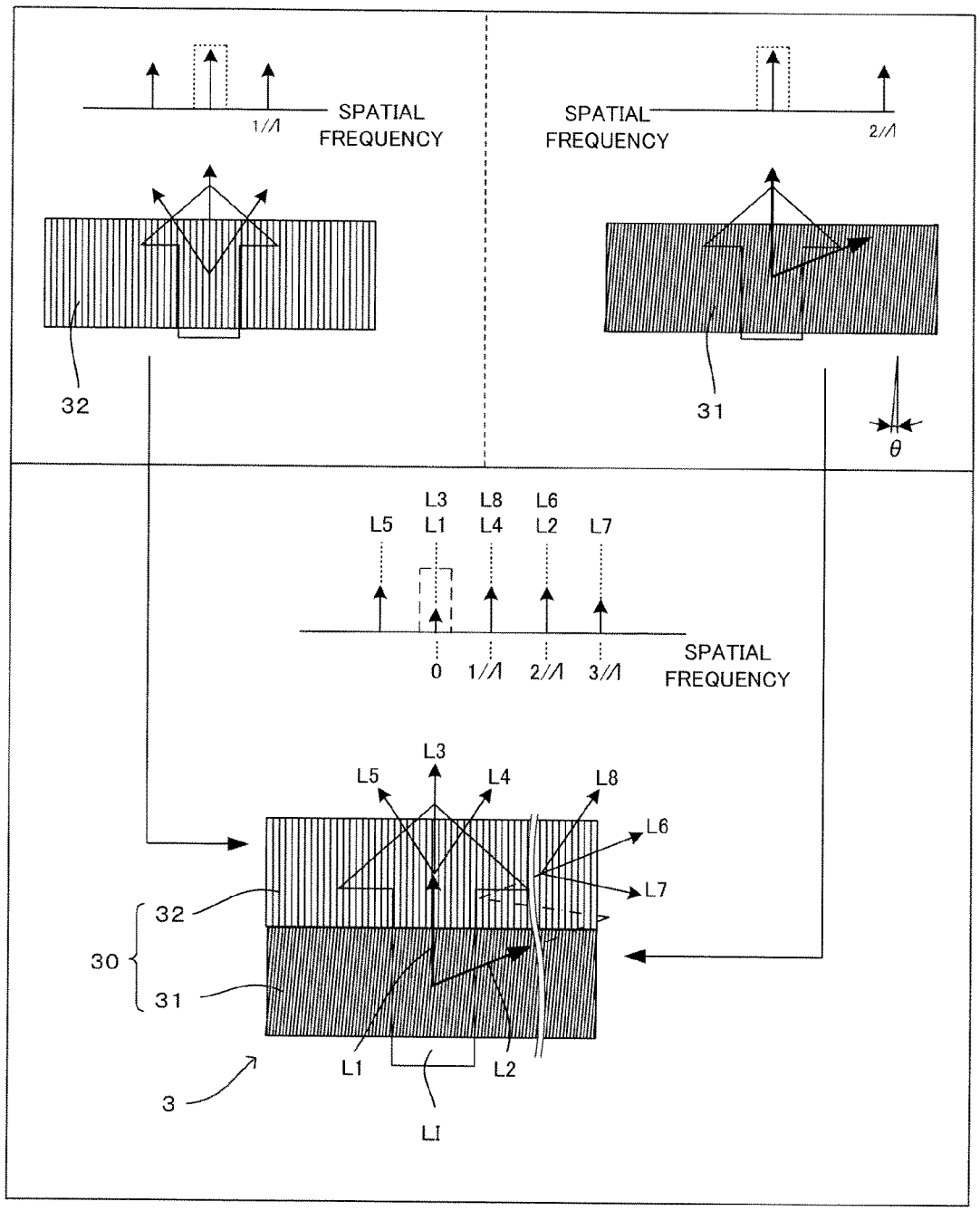
FIG. 6 is a schematic drawing of operations of the light modulator shown in FIGS. 5A through 5C.
Figure 8:
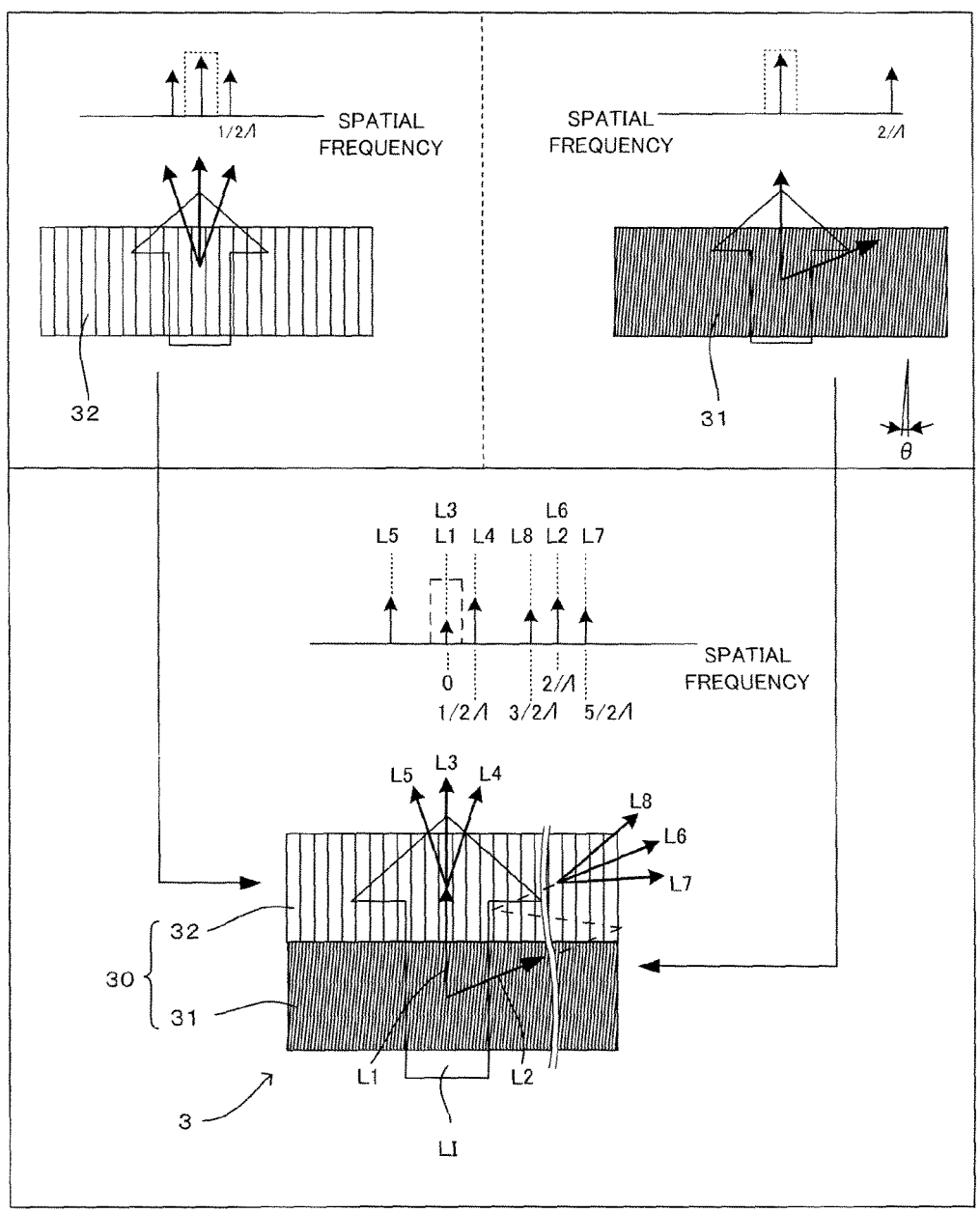
FIG. 8 is a schematic drawing of operations of the light modulator shown in FIGS. 7A through 7C.
Figure 10:
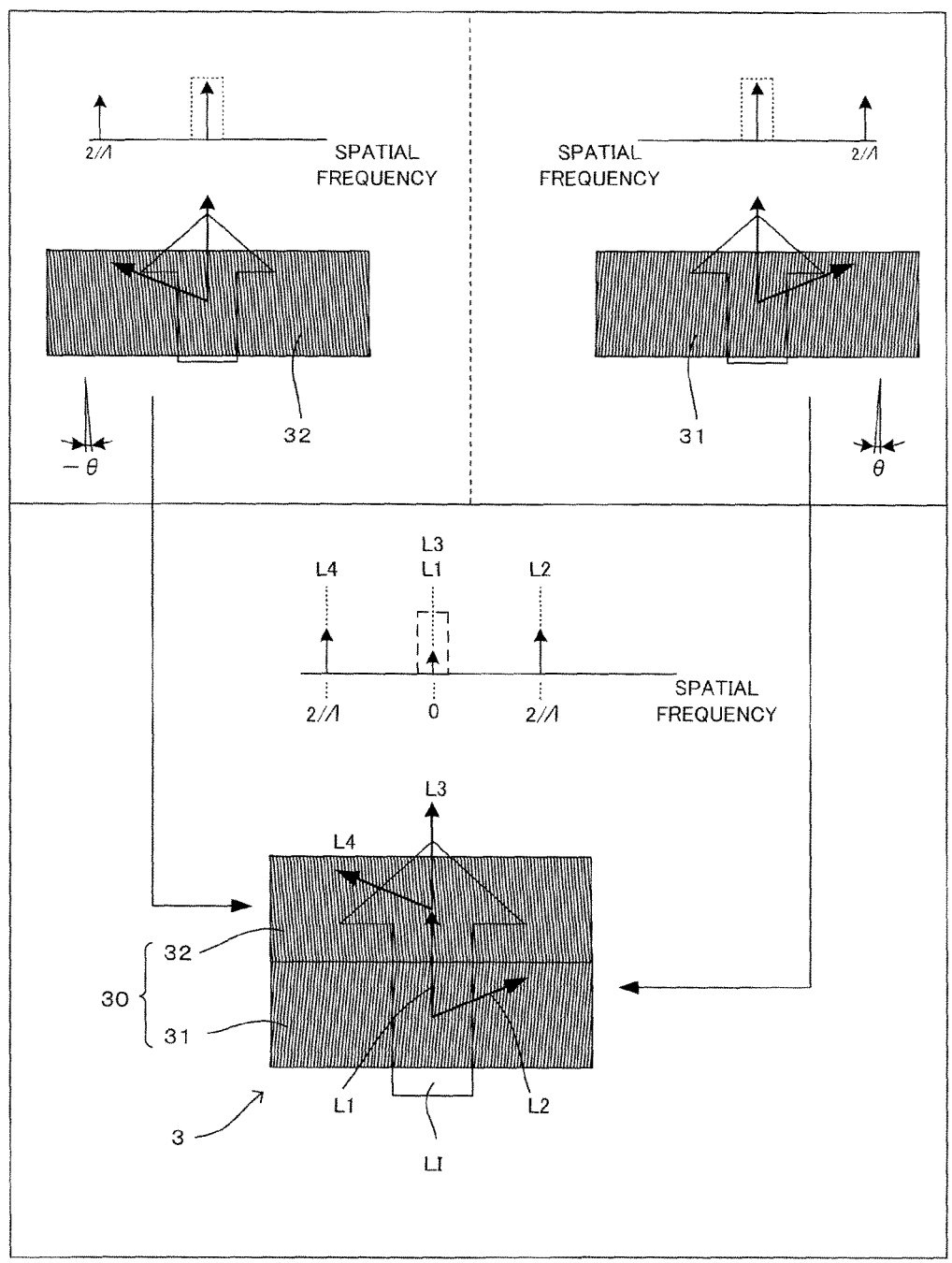
FIG. 10 is a schematic drawing of operations of the light modulator shown in FIGS. 9A through 9C.

The periodic polarization reversal structure having the different periods from each other are provided in the light modulator 3 having the structure above, and the effects of diffraction attained in the periodic polarization reversal structure are different from each other as shown in the upper section of FIG. 4. Therefore, at the location of a far-field pattern, diffracted light appears at the location of the spatial frequency in accordance with the period. In this embodiment, as shown in the lower section of FIG. 4, since the periodic polarization reversal structure having the different periods are arranged in series along the propagation direction Dp, each light exiting the electro-optic crystal substrate 31 is incident to the electro-optic crystal substrate 32 and gets the diffraction effects. In FIG. 4, the symbols "L1" through "L12" are used for the purpose of distinguishing light propagating through the electro-optic crystal substrates 31 and 32 from each other and describing the effects attained by the substrates 31 and 32. The reference symbols "L1" through "L8" in FIGS. 6, 8 and 10 are used for similar purposes.

The light L2 and L3 in the lower section of FIG. 4 are diffracted light from the periodic polarization reversal structure (having the period of $\Lambda 1=2\Lambda$) which is in the electro-optic crystal substrate 31, and to the incident light L1, light L5 and L6 are diffracted light from the periodic polarization reversal structure (having the period of $\Lambda 2=\Lambda$) which is in the electro-optic crystal substrate 32. In this embodiment, since the substrates 31 and 32 both create Raman-Nath diffraction gratings, the angle-dependency of the incident light is low. Hence, light incident to the diffraction gratings at angles are subject to diffraction. To be more specific, diffracted light L2 and L3 created in the former part (the periodic polarization reversal structure within the electro-optic crystal substrate 31) are diffracted in the latter part (the periodic polarization reversal structure within the electro-optic crystal substrate 32). This develops diffracted light L8, L9, L11 and L12.

The period Λ1 in the former part is 2Λ, and the period Λ2 in the latter part is Λ. As the periods Λ1 and Λ2 are integer multiples of each other, diffracted light (of both the basic order and the high order) arising from the periodic polarization reversal structure which has the finer period are created overlapping at the location of the spatial frequency having the most coarse period 2Λ and the location of high-order diffraction (integer multiples) at the far-field pattern location. Hence, the spatial frequency difference will not give rise to a heat frequency in the zone of a lower spatial frequency than the basic-order spatial frequency which has the most coarse period, the diffracted light can be separated from the transmitted light without fail using the aperture plate 42 disposed in the illumination optical system 4 which is a Schlieren optical system, and a high extinction ratio is attained. To be specific, the diffracted light L9 of the basic-order light L7 (=L2) overlaps the diffracted light L3. The diffracted light L8 is created at the location of the high-order spatial frequency 3/2Λ of the spatial frequency 1/2Λ of periodic polarization reversal structure of the most coarse period.

Thus, in this embodiment, diffraction by the periodic polarization reversal structures having the different periods acts multiple times serially. Hence, although in the case of Raman-Nath diffraction which is developed by a single periodic polarization reversal structure at a low voltage and has a long grating length, the intensity of diffraction is insufficient (the extinction ratio is low), use of the plurality of structures makes it possible to realize a sufficient intensity of diffraction. The light modulator 3 according to the first embodiment therefore attains an excellent extinction ratio.

Second Embodiment

FIGS. 5A through 5C are drawings which show the structure of the light modulator according to the second embodiment of the invention, FIG. 5A is a perspective view of the light modulator 3, FIG. 5B is a partially expanded view which shows a former part structure (the first electro-optic crystal substrate 31) and FIG. 5C is a partially enlarged perspective view which shows a latter part structure (the second electro-optic crystal substrate 32). FIG. 6 is a schematic drawing of operations of the light modulator shown in FIGS. 5A through 5C. For the purpose of clearly illustrating the structure of the first electro-optic crystal substrate 31, the rate of magnification in FIG. 5B is higher than that in FIG. 5C.

The second embodiment is basically identical to the first embodiment except that the electro-optic crystal substrate 31 is formed so as to create a Bragg-type diffraction grating. Inside the electro-optic crystal substrate 31, the polarization pairs 313 are arranged in the period Λ1 along the first arrangement direction AD1 which is at the angle θ with respect to the direction X, thereby forming the periodic polarization reversal structure. The angle θ satisfies the Bragg condition. Further, in order to create the Bragg-type diffraction grating by satisfying the relationship Q>10, the period Λ1 is shorter than in the first embodiment. To be specific, the period Λ1 is set to Λ/2 and the period Λ2 (=Λ) is twice the period Λ1.

In the light modulator 3 which has such a structure, diffraction in the former part is of the Bragg type, whereas diffraction in the latter part is of the Raman-Nath type. The trends of diffraction of the former part and the latter part are thus different from each other as show in the upper section of FIG. 6. Hence, at the far-field pattern location, diffraction light appears at the locations of the spatial frequencies which correspond to the periods. In this embodiment as well, as shown in the lower section of FIG. 6, the exiting light subject to Bragg-type diffraction in the electro-optic crystal substrate 31 is incident to the electro-optic crystal substrate 32 and gets Raman-Nath diffraction.

The former part (the first electro-optic crystal substrate 31) creates Bragg-type diffraction as described above, and as the incident light LI is Bragg-diffracted, the diffracted light L2 is emitted from the electro-optic crystal substrate 31 as shown in the lower section of FIG. 6. Meanwhile, the 0-order light L1 is emitted from the electro-optic crystal substrate 31, and like the diffracted light L2, is incident to the electro-optic crystal substrate 32.

Inside the electro-optic crystal substrate 32, the light L1 and L2 are both subject to Raman-Nath diffraction, thereby creating the diffracted light L4, L5, L7 and L8. FIG. 6 (and FIG. 8 which will be referred to later) is a conceptual view in which the diffraction angles are large for the convenience of illustration of diffraction: Light does not return back in the incident direction as that denoted as the diffraction light L7 in particular.

In the second embodiment, the Bragg-type diffraction grating is created inside the former part, and therefore, the diffracted light is emitted only in one direction as FIG. 6 shows. Further, since the parameter Q takes a value smaller than 100 so that the grating length will be insufficient, the transmitted light (which is the incident light as viewed from the latter part) L1 remains. However, in the case of the Raman-Nath diffraction inside the latter part, the angle dependency of the incident light is low, and therefore, the light L2 incident to the diffraction grating at an angle as well is diffracted. In other words, the diffracted light L2 and the transmitted light L1 created in the former part are diffracted in the latter part.

Further, the period Λ1 of the former part (the first electro-optic crystal substrate 31) is Λ/2. Meanwhile, the period Λ2 of the latter part (the second electro-optic crystal substrate 32) is Λ which is double the period of the former part. Hence, the diffracted light L4 and L8 overlap each other at the location of the spatial frequency having the most coarse period Λ at the far-field pattern location. For this reason, the diffracted light (of both the basic order and the high order) owing to the periodic polarization reversal structure having the finer period partially overlap at the locations of the spatial frequency of the most coarse period Λ and high-order diffraction (integer multiples). Hence, the spatial frequency difference will not give rise to a beat frequency in the zone of a lower spatial frequency than the basic-order spatial frequency of the most coarse period, the diffracted light can be separated from the transmitted light without fail using the aperture plate, and a high extinction ratio is attained. That is, diffraction owing to the periodic polarization reversal structure having the different periods from each other acts multiple times serially, sufficient intensity diffraction is achieved. It is therefore possible to obtain a similar effect to that according to the first embodiment, namely, an excellent extinction ratio.

Third Embodiment

Figure 7:
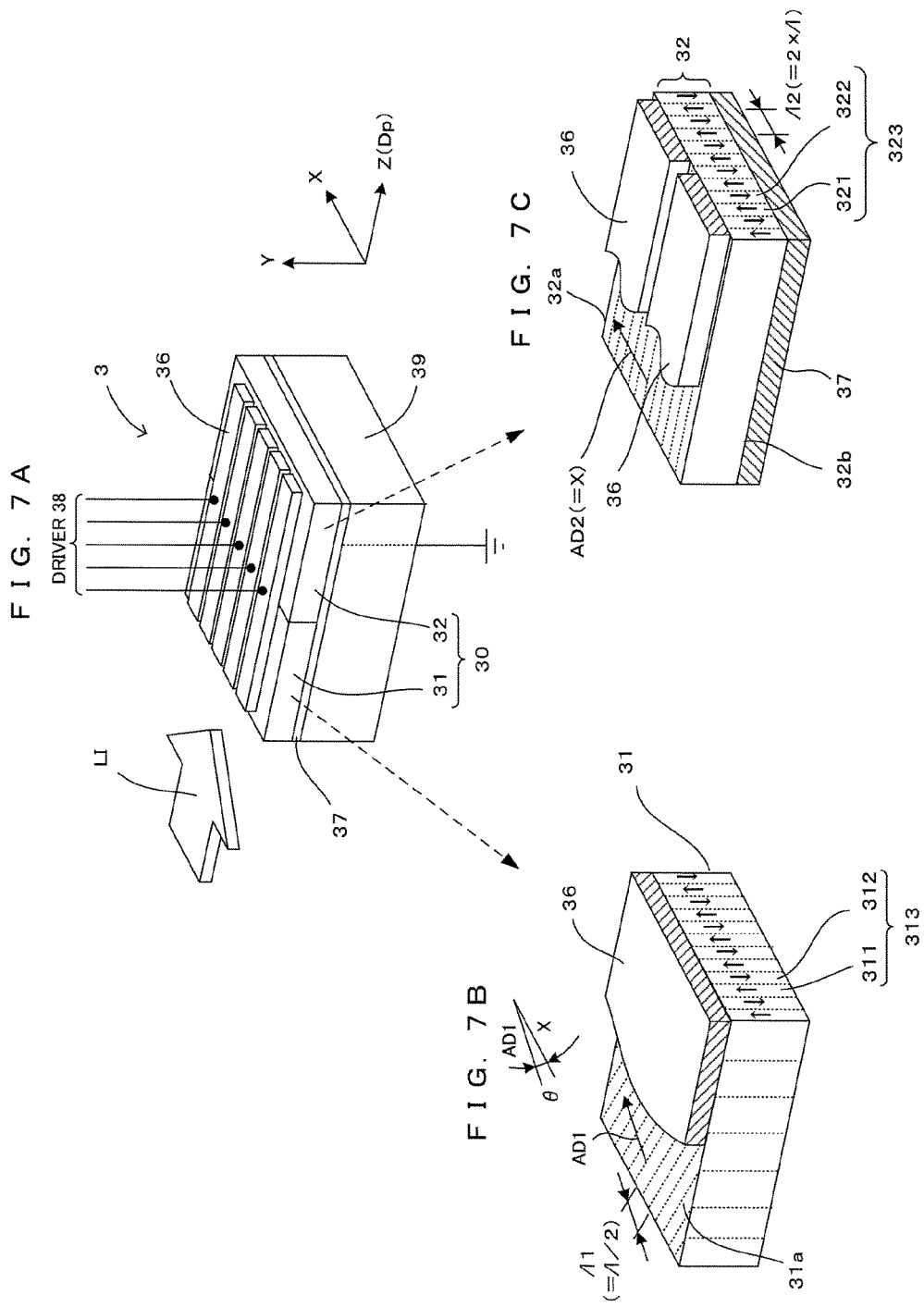
FIGS. 7A through 7C show the structure of the light modulator according to the third embodiment of the invention.

FIGS. 7A through 7C show the structure of the light modulator according to the third embodiment of the invention, and FIG. 8 is a schematic drawing of operations of the light modulator shown in FIGS. 7A through 7C. Only major difference of the third embodiment from the second embodiment is that the period Λ2 of the latter part (the second electro-optic crystal substrate 32) is 2×Λ, and the other structures remain basically unchanged. For the purpose of clearly illustrating the structure of the first electro-optic crystal substrate 31, the rate of magnification in FIG. 7B is higher than that in FIG. 7C.

As in the second embodiment, in the light modulator 3 according to the third embodiment as well, the former part is of the Bragg diffraction type while the latter part is of the Raman-Nath diffraction type. As shown in the lower section of FIG. 8, the incident light LI is Bragg-diffracted, and the diffracted light L2 is emitted from the electro-optic crystal substrate 31. In the meantime, the 0-order light L1 is emitted from the electro-optic crystal substrate 31, and like the diffracted light L2, incident to the second electro-optic crystal substrate 32.

Inside the second electro-optic crystal substrate 32, the light L1 and L2 are both subject to Raman-Nath diffraction, thereby creating the diffracted light L4, L5, L7 and L8. In the third embodiment as well, as in the second embodiment, the Bragg-type diffraction grating is created inside the former part, and therefore, the diffracted light is emitted only in one direction as FIG. 8 shows. Further, since the parameter Q takes a value smaller than 100 so that the grating length will be insufficient, the transmitted light (which is the incident light as viewed from the latter part) L1 remains. However, in the case of the Raman-Nath diffraction inside the latter part, the angle dependency of the incident light is low, and therefore, the light L2 incident to the diffraction grating at an angle as well is diffracted.

Further, the period Λ1 of the former part (the first electro-optic crystal substrate 31) is Λ/2. Meanwhile, the period Λ2 of the latter part (the second electro-optic crystal substrate 32) is 2×Λ which is four times larger than the period of the former part. Hence, the diffracted light L2 created by Bragg diffraction inside the former part and transmitted light L1 are subject to Raman-Nath diffraction inside the latter part, thereby creating the diffracted light L7, L8, L4 and L5. Since the period Λ2 of the latter part is four times larger than the period of the former part as described above, the diffracted light L8 and L4 will not clearly overlap each other at the far-field pattern location. For this reason, diffracted light including high-order diffracted light is created only at the locations of the spatial frequency having the most coarse period 2Λ and integer multiples of the spatial frequency. Hence, the spatial frequency difference will not give rise to a beat frequency in the zone of a lower spatial frequency than the basic-order spatial frequency which has the most coarse period, the diffracted light can be separated from the transmitted light without fail using the aperture plate 42, and a high extinction ratio is attained. That is, diffraction owing to the periodic polarization reversal structure having the different periods from each other acts multiple times serially, sufficient intensity of diffraction is achieved. It is therefore possible to obtain a similar effect to those according to the first and the second embodiments, namely, an excellent extinction ratio.

Fourth Embodiment

Figure 9:
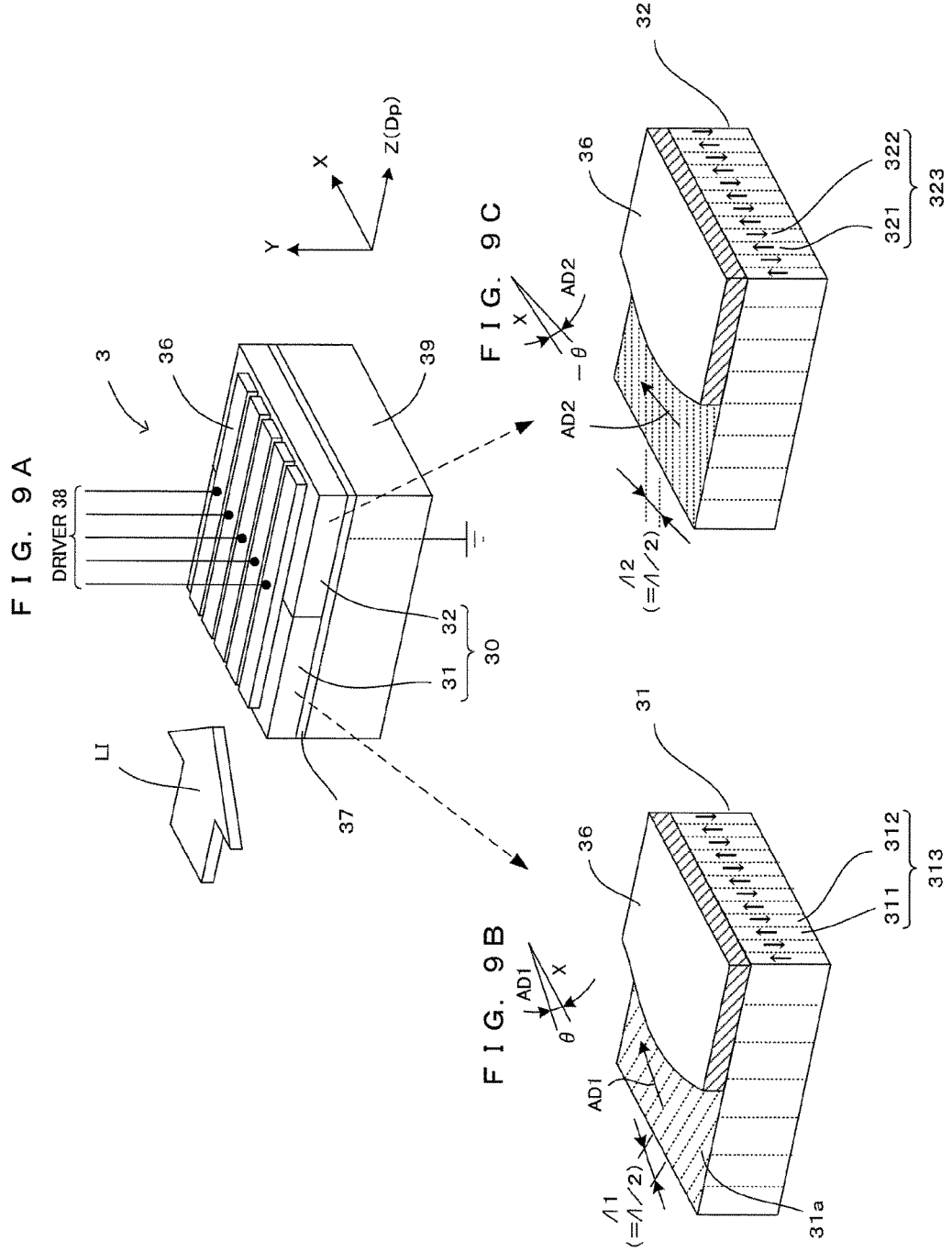
FIGS. 9A through 9C show the structure of the light modulator according to the forth embodiment of the invention.

FIGS. 9A through 9C show the structure of the light modulator according to the forth embodiment of the invention, and FIG. 10 is a schematic drawing of operations of the light modulator shown in FIGS. 9A through 9C. The characteristic of the fourth embodiment is that both the former part and the latter part are structured as the Bragg diffraction type. To be more specific, in the former part (the electro-optic crystal substrate 31), the polarization pairs 313 are arranged in the period Λ1 (=Λ/2) along the first arrangement direction AD1 which is at the angle θ with respect to the direction X, thereby forming the periodic polarization reversal structure. Meanwhile, in the latter part (the electro-optic crystal substrate 32), the polarization pairs 323 are arranged in the period Λ2 (=Λ/2) along the second arrangement direction AD2 which is at the angle (−θ) with respect to the direction X, thereby forming the periodic polarization reversal structure.

In the fourth embodiment as well, the periodic polarization reversal structures having the different periods from each other are arranged in series in the propagation direction Dp (=the direction Z) of light. At the far-field pattern location therefore, diffracted light is created at the locations of the spatial frequencies which correspond to the respective periods. That is, in FIG. 10, the light L2 is diffracted light resulting from Bragg diffraction developed by the periodic polarization reversal structure provided in the former part while the light L4 is diffracted light resulting from Bragg diffraction developed by the periodic polarization reversal structure provided in the latter part.

In the fourth embodiment, as described above, both the former part and the latter part create Bragg-type diffraction gratings, and diffracted light by Bragg diffraction inside each part is emitted in only one direction. Further, the gratings are inclined at the angles of θ and −θ with respect to the propagation direction Dp of light. As for each one of the former part and the latter part, the parameter Q takes a value smaller than 100 and the grating length is accordingly insufficient. Hence, the transmitted light (which is the incident light as viewed from the latter part) L1 remains in the former part. Since the angle dependency of incident light is high in the case of Bragg diffraction, the diffracted light L2 from the former part is not diffracted in the latter part. Although the gratings created in the former part and the latter part are inclined in the opposite directions to each other, since the both parts have the period of Λ/2 and are integer multiple (the factor of one in this embodiment), the diffracted light L2 resulting from Bragg diffraction inside the former part is allowed to propagate as is through the latter part, whereas the transmitted light L1 is Bragg-diffracted by the grating inside the latter part. Since the former part and the latter part are the same in terms of spatial frequency but opposite to each other in terms of direction, a beat frequency due to a spatial frequency difference will not develop within the zone of a lower spatial frequency than the basic-order spatial frequency, the diffracted light can be separated from the transmitted light without fail using the aperture plate 42, and a high extinction ratio is attained. That is, diffraction owing to the two periodic polarization reversal structure acts multiple times serially, sufficient intensity of diffraction is achieved. It is therefore possible to obtain a similar effect to those according to the first through the third embodiments, namely, an excellent extinction ratio.

Fifth Embodiment

While the two periodic polarization reversal structures are disposed serially in the light modulators 3 according to the first through the fourth embodiments and a high extinction ratio is accordingly achieved, three or more periodic polarization reversal structures may be disposed serially, a similar effect is attained.

Figure 11:
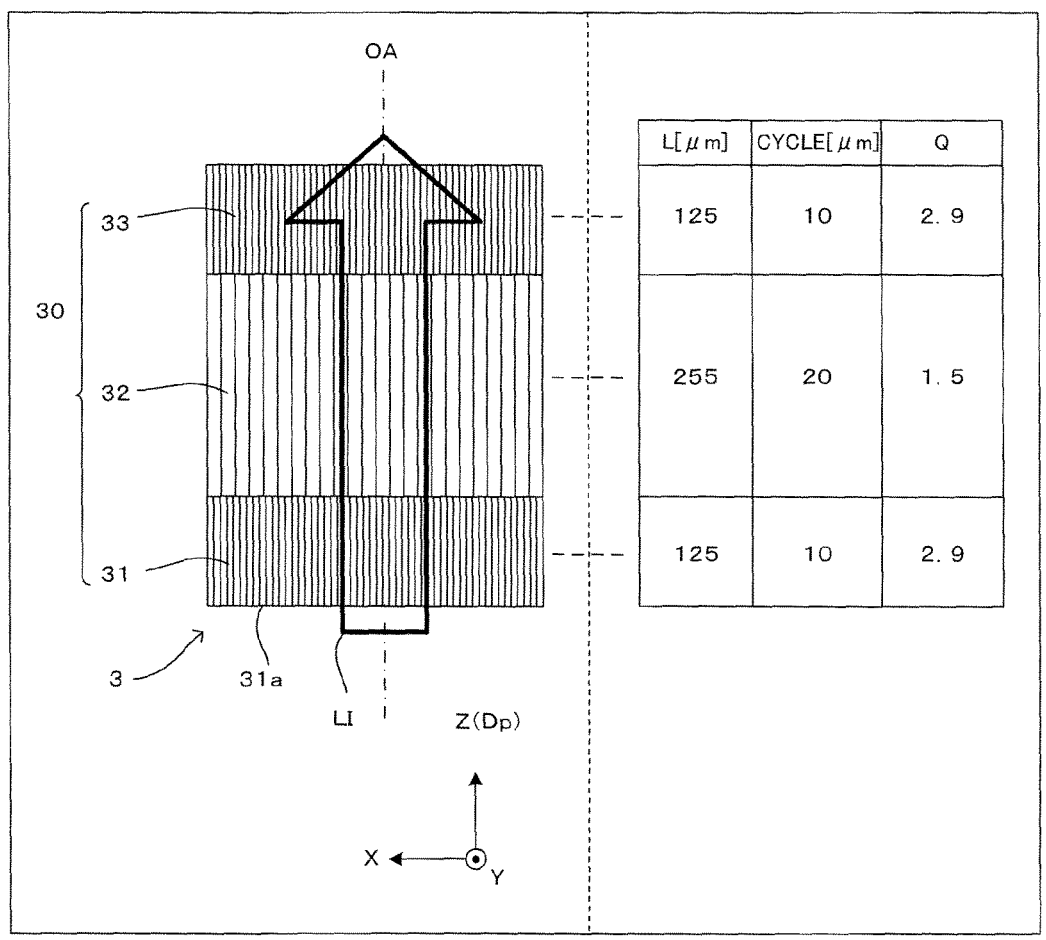
FIG. 11 shows the structure of the light modulator according to the fifth embodiment of the invention.

FIG. 11 shows the structure of the light modulator according to the fifth embodiment of the invention. In the fifth embodiment, three electro-optic crystal substrates 31, 32 and 33 are disposed, as the electro-optic crystal substrate 30, in series in this order along the propagation direction Dp (the direction Z) of light on a hold plate (not shown in FIG. 11).

The electro-optic crystal substrate 31 is shaped like a thin plate or slab and made of LN single crystals. Inside the electro-optic crystal substrate 31, polarization pairs are arranged in the period $\Lambda 1$ (=$\Lambda$) along the first arrangement direction AD1 (which is the direction X in this embodiment). The electro-optic crystal substrate 33 has the same structure as that of the electro-optic crystal substrate 31. The electro-optic crystal substrates 31 and 33 thus have the same periodic polarization reversal structures.

Further, the electro-optic crystal substrates 31 and 33 sandwich the electro-optic crystal substrate 32. The electro-optic crystal substrate 32 is the same as the electro-optic crystal substrates 31 and 32 except that it has a different period. In short, inside the electro-optic crystal substrate 32, polarization pairs are arranged in the period $\Lambda 2$ (=$2\times\Lambda$) longer than the period in the electro-optic crystal substrates 31 and 33 along the arrangement direction (which is the direction X in this embodiment). Thus, the electro-optic crystal substrate 32 as well has a periodic polarization reversal structure like the electro-optic crystal substrates 31 and 33. As the voltage is applied upon the signal electrodes 36, these three electro-optic crystal substrates 31, 32 and 33 create Raman-Nath diffraction gratings.

The light modulator 3 in which the three electro-optic crystal substrates 31, 32 and 33 are disposed in series, too, attains a high extinction ratio, which is similar to the first through the fourth embodiments. For instance, the electro-optic crystal substrates 31, 32 and 33 may be so structured to satisfy the values which are in the right-hand side table in FIG. 11. In this example, the grating lengths L of the electro-optic crystal substrates 31, 32 and 33 are set to 125 [µm], 255 [µm] and 125 [µm], respectively. The periods $\Lambda 1$, $\Lambda 2$ and $\Lambda 3$ are set to 10 [µm], 20 [µm] and 10 [µm], respectively. Under the following operation condition, the values Q in the periodic polarization reversal structures in the electro-optic crystal substrates 31, 32 and 33 are respectively 2.9, 1.5 and 2.9:

Inter-electrode distance g=35 [µm];
Wavelength $\lambda$=808 [µm];
Pockels constant $r_{33}$=3.6×10$^{-11}$ [m/V];
Index of refraction $n_e$=2.18; and
Applied voltage=111 [V] ($\Delta n_e$=7.5×10$^4$).

Figure 12:
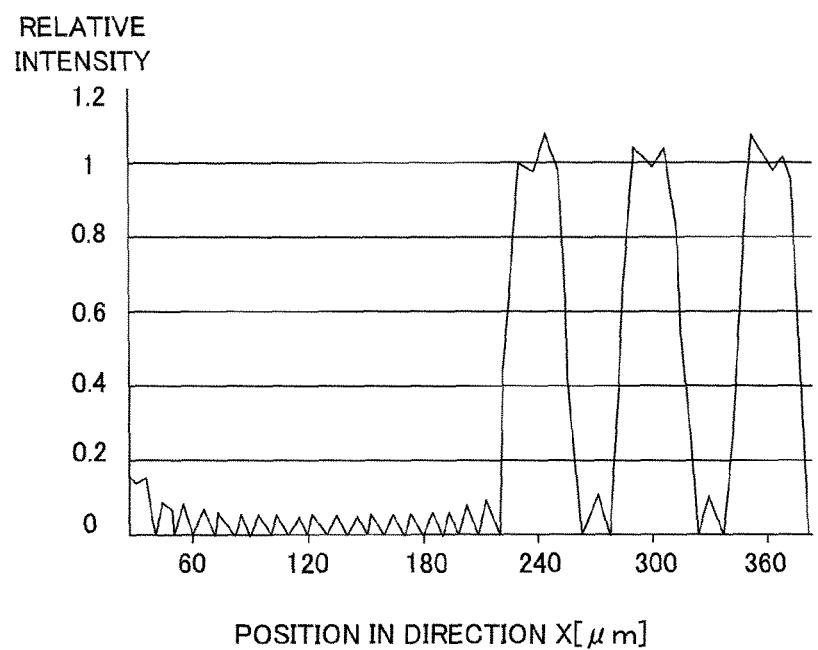
FIG. 12 shows spatial light modulation on the image plane as it is obtained when light is incident perpendicularly upon the light modulator shown in FIG. 11.
Figure 13:
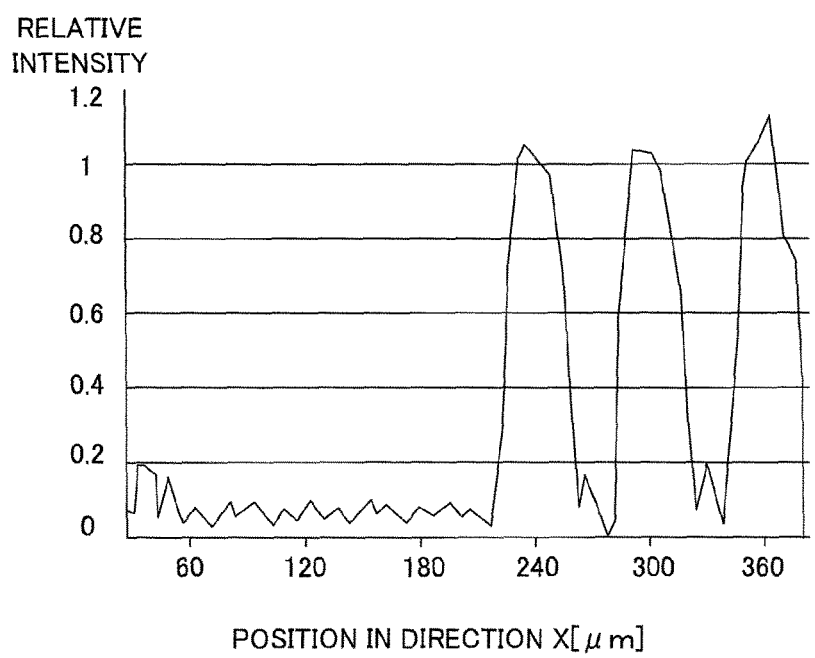
FIG. 13 shows spatial light modulation on the image plane as it is obtained when light is incident upon the light modulator shown in FIG. 11 at the angle of 0.5 degree.

When the light modulator 3 having the structure shown in FIG. 11 is applied to the exposure head 1 and operated under the operation condition above, an excellent extinction ratio is achieved as shown in FIGS. 12 and 13.

FIG. 12 shows spatial light modulation on the image plane as it is obtained when light is incident perpendicularly upon the light modulator shown in FIG. 11, and FIG. 13 shows spatial light modulation on the image plane as it is obtained when light is incident upon the light modulator shown in FIG. 11 at the angle of 0.5 degree. These drawings are indicative of ON/OFF control of light over six channels by use of the light modulator 3 shown in FIG. 11. The basic structure of the exposure head which uses the light modulator 3 is the same as that of the exposure head shown in FIG. 1 except for the different number of channels, and is capable of controlling ON and OFF every 60 [µm].

Extinction of light modulation at the surface of the substrate (image plane) in accordance with ON/OFF of light in six channels which are in the right-hand side half of the light modulator 3 is simulated. BPM (Beam Propagation Method) is used for the section of the periodic polarization reversal structures (the electro-optic crystal substrate 30 formed by the electro-optic crystal substrates 31 through 33), the complex amplitude of light as it exits the electro-optic crystal substrate 31 is Fourier-transformed for the section from the exit-side end of the electro-optic crystal substrate 30 through the substrate W, and a spatial filter is then added at the location of the aperture 421, followed by inverse Fourier transformation, thereby yielding the complex amplitude at the surface of the substrate W and simulating the situation of extinction.

In FIGS. 12 and 13, the approximately flat sections on the left-hand side are indicative of those channels which are OFF and the corresponding incident light is diffracted in response to a proper voltage applied upon the electrodes in the left-hand half area. When the incident light LI is incident perpendicularly to the incident-side edge surface of the electro-optical crystal substrate 30, namely, the (−Z)-side edge surface 31a of the electro-optical crystal substrate 31, the amount of residual light is approximately 3.2 [%] and the extinction ratio is approximately 30:1. Thus, the extinction ratio is excellent. When the incident light LI is incident to the incident-side edge surface of the electro-optical crystal substrate 30 at the angle of 0.5 degree with respect to the optical axis OA, the amount of residual light is larger but is suppressed to 6.5 [%].

As described above, the excellent extinction ratio is obtained according to the fifth embodiment, as in the first through the fourth embodiments. Even if the location of the light modulator 3 is off the design location within the exposure head and the incident light LI consequently is incident at the angle of approximately 0.5 degree with respect to the optical axis OA, it is possible to obtain a sufficient extinction ratio. This means that the degree of parallelization among rays of the incident light LI somewhat worsens. For example, despite inclination for 0.1 through 0.5 degree with respect to the propagation direction Dp of light, use of the light modulator shown in FIG. 11 realizes light modulation at a favorable extinction ratio. When high-output light is modulated by use of a high-output infrared semiconductor laser device (which is generally known as "bar laser") having a plurality of emission points for example as the light source 21 of the exposure head, it is hard for the rays of the incident light LI to be parallel since the light source 21 is not a point light source. However, use of the light modulator shown in FIG. 11 makes it possible to realize high-output expose at a favorable extinction ratio.

Sixth Embodiment

Figure 14:
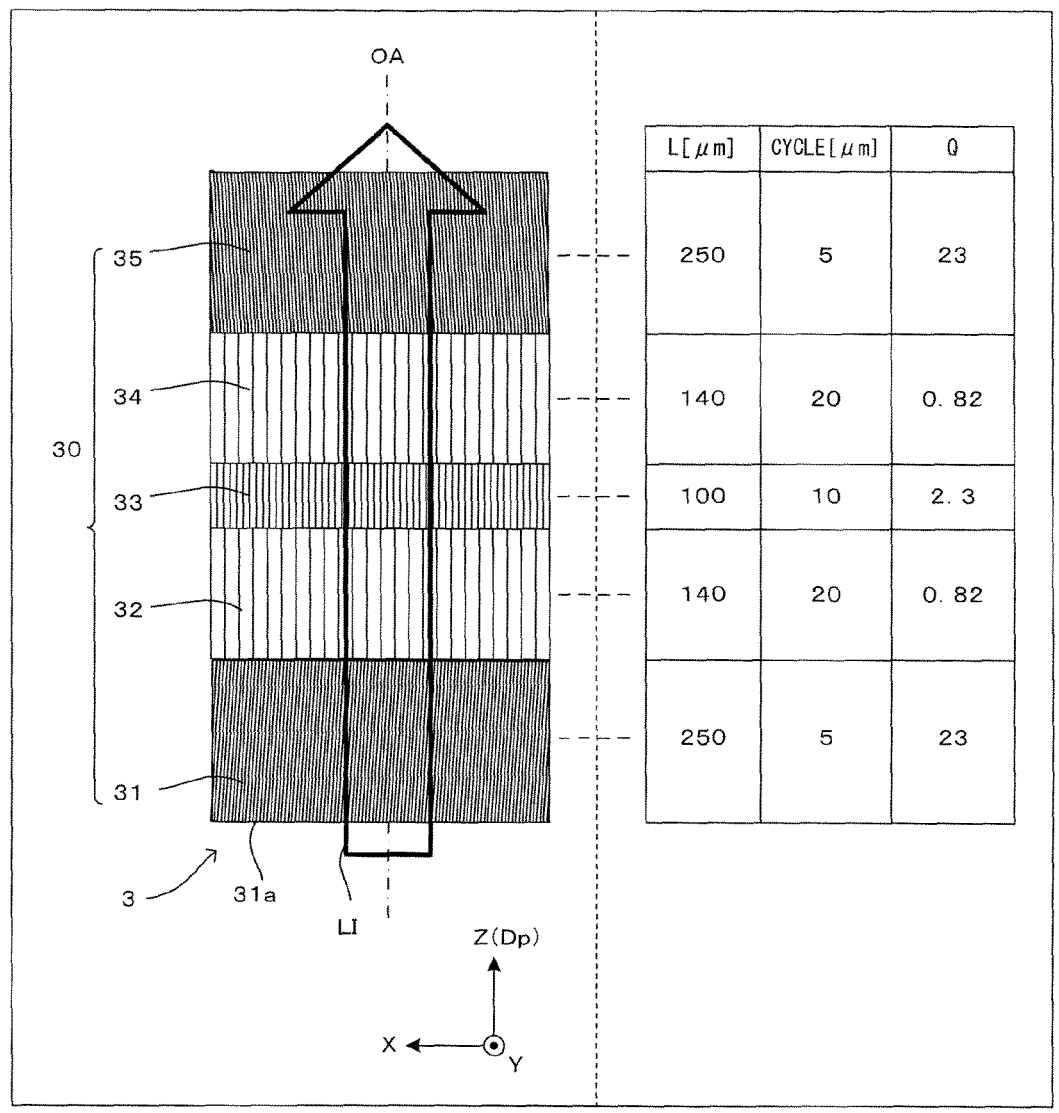
FIG. 14 shows the structure of the light modulator according to the sixth embodiment of the invention.

FIG. 14 shows the structure of the light modulator according to the sixth embodiment of the invention. In the sixth embodiment, five electro-optic crystal substrates 31 through 35 are disposed, as the electro-optic crystal substrate 30, in series in this order along the propagation direction Dp (the direction Z) of light on a hold plate (not shown in FIG. 14).

The electro-optic crystal substrate 31 is shaped like a thin plate or slab and made of LN single crystals. Inside the electro-optic crystal substrate 31, polarization pairs are arranged in the period $\Lambda 1$ (=$\Lambda$) along an arrangement direction which is at the Bragg angle of $\theta$ with respect to the orthogonal direction (which is the direction X in this embodiment) to the propagation direction Dp of light. The electro-optic crystal substrate 35 has a similar structure to that of the electro-optic crystal substrate 31 except that the arrangement direction of the polarization pairs is different. That is, inside the electro-optic crystal substrate 35, the polarization pairs are arranged in the period Λ5 (=Λ) along the arrangement direction which is at the Bragg angle of (−θ) with respect to the orthogonal direction (which is the direction X in this embodiment) to the propagation direction Dp of light. Thus, the electro-optic crystal substrates 31 and 35 which are respectively on the incident side and the exit side of the light modulator 3 are of the Bragg diffraction type.

The electro-optic crystal substrates 31 and 35 sandwich the three electro-optic crystal substrates 32 through 34. The electro-optic crystal substrates 32 through 34 are all of the Raman-Nath diffraction type. In other words, the electro-optic crystal substrate 32 is shaped like a thin plate or slab and made of LN single crystals. Of these substrates, inside the electro-optic crystal substrate 32, the polarization pairs are arranged in the longer period Λ2 (=4×Λ) than those of the electro-optic crystal substrates 31 and 35 along the arrangement direction (which is the direction X in this embodiment). The electro-optic crystal substrate 34 as well has the same structure as that of the electro-optic crystal substrate 32. The electro-optic crystal substrates 32 and 34 thus have the same periodic polarization reversal structures.

Further, the electro-optic crystal substrates 32 and 34 sandwich the electro-optic crystal substrate 33. The electro-optic crystal substrate 33 has the same structure as those of the electro-optic crystal substrates 32 and 34 except for the different period. That is, inside the electro-optic crystal substrate 33, the polarization pairs are arranged in the period Λ3 (=2×Λ), which is shorter than those of the electro-optic crystal substrates 32 and 34 but is longer than those of the electro-optic crystal substrates 31 and 35, along the arrangement direction (which is the direction X in this embodiment).

The light modulator 3 in which the five electro-optic crystal substrates 31 through 35 are disposed in series, too, attains a high extinction ratio, which is similar to the first through the fifth embodiments. For instance, the electro-optic crystal substrates 31 through 35 may be so structured to satisfy the values which are in the right-hand side table in FIG. 14. In this example, the grating lengths L of the electro-optic crystal substrates 31 through 35 are set to 250 [μm], 140 [μm], 100 [μm], 140 [μm] and 250 [μm], respectively. The periods Λ1 through Λ5 are set to 5 [μm], 20 [μm], 10 [μm], 20 [μm] and 5 [μm], respectively. Under the following operation condition, the values Q in the periodic polarization reversal structures inside the electro-optic crystal substrates 31 through 35 are respectively 23, 0.82, 2.3, 0.82 and 23:

Inter-electrode distance g=35 [μm];
Wavelength λ=808 [μm];
Pockels constant $r_{33}$=3.6×10$^{-11}$ [m/V];
Index of refraction $n_e$=2.18; and
Applied voltage=115 [V] ($\Delta n_e$=7.55×10$^4$).

Figure 15:
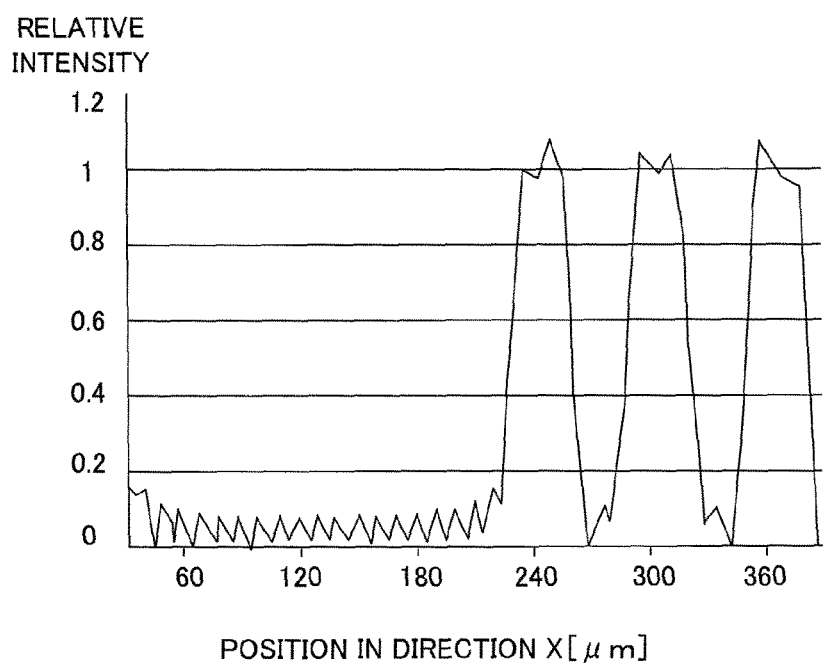
FIG. 15 shows spatial light modulation on the image plane as it is obtained when light is incident perpendicularly to the light modulator shown in FIG. 14.
Figure 16:
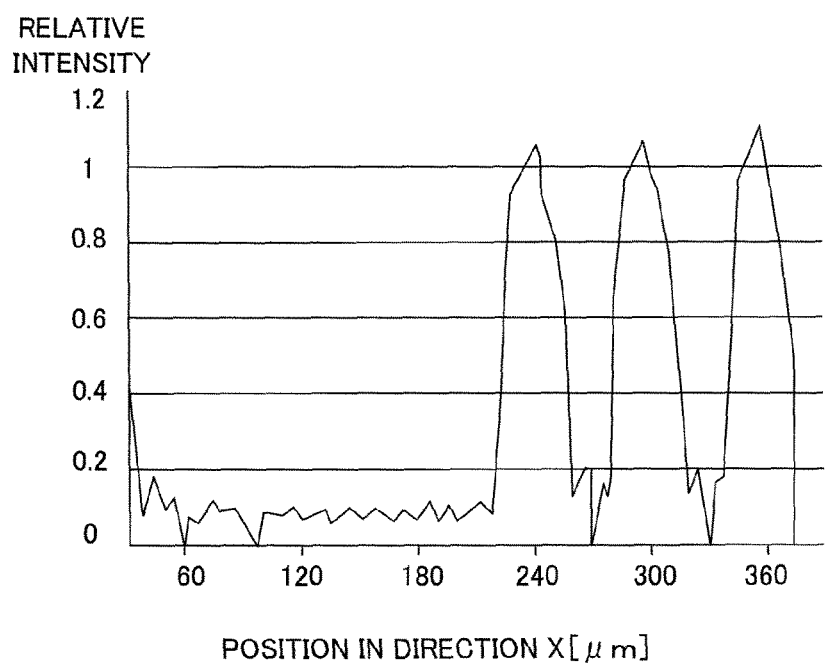
FIG. 16 shows spatial light modulation on the image plane as it is obtained when light is incident to the light modulator shown in FIG. 14 at the angle of 0.5 degree.

When the light modulator 3 having the structure shown in FIG. 14 is applied to the exposure head 1 and operated under the operation condition above, an excellent extinction ratio is achieved as shown in FIGS. 15 and 16.

FIG. 15 shows spatial light modulation on the image plane as it is obtained when light is incident perpendicularly to the light modulator shown in FIG. 14, and FIG. 16 shows spatial light modulation on the image plane as it is obtained when light is incident to the light modulator shown in FIG. 14 at the angle of 0.5 degree. These drawings are indicative of ON/OFF control of light over six channels by use of the light modulator 3 shown in FIG. 14 as in the fifth embodiment.

In FIGS. 15 and 16, the approximately flat sections on the left-hand side are indicative of those channels which are OFF and the corresponding incident light is diffracted in response to a proper voltage applied upon the electrodes in the left-hand half area. When the incident light LI is incident perpendicularly to the incident-side edge surface of the electro-optical crystal substrate 30, namely, the (−Z)-side edge surface 31a of the electro-optical crystal substrate 31, the amount of residual light is approximately 4.2 [%]. When the incident light LI incident to the incident-side edge surface of the electro-optical crystal substrate 30 at the angle of 0.5 degree with respect to the optical axis OA, the amount of residual light is approximately 3.5 [%].

As described above, the excellent extinction ratio is obtained according to the sixth embodiment, as in the first through the fifth embodiments. In addition, as in the fifth embodiment, a sufficient extinction ratio is obtained even if the incident light LI is incident at the angle of approximately 0.5 degree with respect to the optical axis OA, and it is possible to modulate light at a favorable extinction ratio even when the degree of parallelization among rays of the incident light LI somewhat worsens. When high-output light is modulated by use of a high-output infrared semiconductor laser device comprising a plurality of emission points, e.g., bar laser, it is hard for the rays of the incident light LI to be parallel since the light source 21 is not a point light source. However, use of the light modulator shown in FIG. 14 makes it possible to realize high-output expose at a favorable extinction ratio.

<Summary Regarding Light Modulator>

In the first through the sixth embodiments above, the signal electrodes 36 are one example of "the first electrode(s)" of the invention. While the common electrode 37 is an example of "the second electrode" of the invention, instead of using the common electrode 37, an opposed electrode may be disposed on the lower principal surface of the electro-optic crystal substrate for each signal electrode 36 or for every few signal electrodes 36 and each such opposed electrode may function as "the second electrode" of the invention. Further, of the two electro-optic crystal substrates which are disposed adjacent to each other in the propagation direction Dp of light, the upstream-side one along the propagation direction Dp corresponds to "the first electro-optic crystal substrate" of the invention, and the period and the arrangement direction of the polarization pairs inside this electro-optic crystal substrate respectively correspond to "the first period" and "the first arrangement direction" of the invention. Meanwhile, the downstream-side electro-optic crystal substrate along the propagation direction Dp corresponds to "the second electro-optic crystal substrate" of the invention, and the period and the arrangement direction of the polarization pairs inside this electro-optic crystal substrate respectively correspond to "the second period" and "the second arrangement direction" of the invention. The condition that the first period and the second period are different from each other corresponds to "the first condition" of the invention, and the condition that the first arrangement direction and the second arrangement direction are different from each other corresponds to "the second condition" of the invention. The extinction ratio improves as at least one of the first condition and the second condition is satisfied.

According to these embodiments concerning such structures, the first electro-optic crystal substrate and the second electro-optic crystal substrate are structured so as to satisfy as at least one of the first condition and the second condition. Hence, when the voltage is applied upon the first electro-optic crystal substrate and the second electro-optic crystal substrate, the diffraction grating created inside the first periodic polarization reversal structure in the first electro-optic crystal substrate and the diffraction grating created inside the second periodic polarization reversal structure in the second electro-optic crystal substrate are different from each other. When light passed through the first electro-optic crystal substrate without modulated sufficiently despite modulating the light by the first electro-optic crystal substrate, therefore the passing light is modulated by the second electro-optic crystal substrate. This reduces the amount of residual light passing through both the first electro-optic crystal substrate and the second electro-optic crystal substrate without getting diffracted by any one of the first electro-optic crystal substrate and the second electro-optic crystal substrate when the voltage is applied, and therefore, a high extinction ratio is attained. In addition, even when incident light to the light modulator 3 includes rays which are at the angle of 0.1 degree or larger with respect to the propagation direction Dp for instance, an excellent extinction ratio is obtained. Further, it is possible to draw a pattern at a relatively low voltage of around 110 [V].

These effects will now be discussed in relation to the value Q. Under the section <Relationship between Structure of Electro-optic Crystal Substrate and Extinction Ratio> above, using practical numerical figures such as the periods of the periodic polarization reversal structures and the thicknesses of the crystals (inter-electrode distances), the situation in which Q=0.1 is discussed, from which discussion it is seen that the applied voltage is too high and the difficulty is expected for practical use. It is therefore necessary for at least the parameter Q to exceed 0.1. However, in the Raman-Nath zone, the angle-dependency of the rays of the incident light LI is very low, it is possible to use light containing rays which are at the angle of 0.1 degree or larger for example as described above. When the value Q is larger, e.g., 23 as in the electro-optic crystal substrates 31 and 35 according to the sixth embodiment, but is up to approximately 100 giving rise to as Bragg diffraction, the angle-dependency of the rays of the incident light LI is not very high, and therefore, a favorable extinction ratio is obtained even despite use of light which contains rays which are at the angle of 0.1 degree or larger for example as described above. It is therefore desirable that the value Q in each electro-optic crystal substrate is larger than 0.1 but smaller than 100.

While the above deals with the relationship between two electro-optic crystal substrates, the relationship among three or more electro-optic crystal substrates is basically the same. In the fifth and the sixth embodiments for example, of the three electro-optic crystal substrates which are adjacent to each other in the propagation direction Dp of light, the most upstream-side one in the propagation direction Dp corresponds to "the first electro-optic crystal substrate" of the invention, and the period and the arrangement direction of the polarization pairs inside this electro-optic crystal substrate respectively correspond to "the first period" and "the first arrangement direction" of the invention. The most downstream-side electro-optic crystal substrate along the propagation direction Dp corresponds to "the third electro-optic crystal substrate" of the invention, and the period and the arrangement direction of the polarization pairs inside this electro-optic crystal substrate respectively correspond to "the third period" and "the third arrangement direction" of the invention. The substrate sandwiched by the most upstream-side electro-optic crystal substrate and the most downstream-side electro-optic crystal substrate corresponds to "the second electro-optic crystal substrate" of the invention, and the period and the arrangement direction of the polarization pairs inside this electro-optic crystal substrate respectively correspond to "the second period" and "the second arrangement direction" of the invention. Besides the first condition and the second condition above, the condition that the third period is different from the second period corresponds to "the third condition" and the condition that the third arrangement direction is different from the second arrangement direction corresponds to "the fourth condition." The extinction ratio improves as at least one of the third condition and the fourth condition is satisfied. Of course, the first condition and the second condition may be satisfied additionally.

According to these embodiments concerning such structures, the second electro-optic crystal substrate and the third electro-optic crystal substrate are structured so as to satisfy as at least one of the third condition and the fourth condition. Hence, when the voltage is applied upon the second electro-optic crystal substrate and the third electro-optic crystal substrate, the diffraction grating created inside the second periodic polarization reversal structure in the second electro-optic crystal substrate and the diffraction grating created inside the third periodic polarization reversal structure in the third electro-optic crystal substrate are different from each other. When 0-order light passed through the second electro-optic crystal substrate without modulated sufficiently despite modulating the light by the first electro-optic crystal substrate and the second electro-optic crystal substrate, therefore the passing light is modulated by the third electro-optic crystal substrate. This reduces the amount of residual light passing through the first electro-optic crystal substrate through the third electro-optic crystal substrate without getting diffracted by any one of the first electro-optic crystal substrate through the third electro-optic crystal substrate, and therefore, attains even higher extinction ratio.

<Others>

The invention is not limited to the embodiment described above but may be modified in various manners in addition to the embodiments above, to the extent not deviating from the object of the invention. For instance, although the electro-optic crystal substrate 30 is formed by two, three or five the electro-optic crystal substrates in the embodiments above, the number of substrates which form the electro-optic crystal substrate 30 is not limited to these but may be any desired number larger than one.

Further, in the embodiments above, the periods in the plurality of electro-optic crystal substrates which form the electro-optic crystal substrate 30 are integer multiples of each other as follows:

First period $\Lambda 1$:second period $\Lambda 2$=2:1 in the first embodiment;

First period $\Lambda 1$:second period $\Lambda 2$=1:2 in the second embodiment;

First period $\Lambda 1$:second period $\Lambda 2$=1:4 in the third embodiment;

First period $\Lambda 1$:second period $\Lambda 2$=1:1 in the fourth embodiment;

First period $\Lambda 1$:second period $\Lambda 2$:third period $\Lambda 3$=1:2:1 in the fifth embodiment; and First period $\Lambda 1$:second period $\Lambda 2$:third period $\Lambda 3$:fourth period $\Lambda 4$:fifth period $\Lambda 5$=1:4:2:4:1 in the sixth embodiment.

These period ratios are not limiting but may be chosen so as to satisfy the first condition, the third condition, etc. For instance, the period ratios may be set to be integer multiples of the shortest one of the plurality of periods.

Further, in the embodiments above, the plurality of signal electrodes 36 are provided, and the efficiency of diffraction is changed in each area sandwiched by each signal electrode 36 and the common electrode 37, thereby modulating light in the plurality of channels: the light modulators 3 described above all function as spatial light modulators. However, the invention is not applied only to spatial light modulators but may be applied to a single-channel light modulator.

Further, in the second, the third, the fourth and the sixth embodiments above, the polarization pairs are arranged at the Bragg angle θ with respect to the direction X inside the Bragg-type electro-optic crystal substrates, and the angles of incident rays to the respective Bragg-type diffraction gratings satisfy the Bragg condition. However, since the drawback of Bragg diffraction, namely, the extremely narrow range of the angle between a grating and incident light can be mitigated according to these embodiments, the arrangement direction of the polarization pairs may be changed to be off the Bragg angle θ. Particularly when a high-output infrared semiconductor laser device comprising a plurality of emission points is used as the light source 21, although it is difficult to ensure that the incident light LI is parallel light, non-parallel light can be dealt with when the arrangement direction is set outside the Bragg condition.

The light modulator according to the invention is applicable to various types of apparatuses, and as described above, favorably applicable to the exposure head which modulates the light from the light source and accordingly irradiates an area-to-be-exposed such as a substrate surface. Further, the exposure head as well is applicable to various apparatuses. For instance, the exposure head may be applied to a pattern drawing apparatus, in this case it is possible to draw a high-precision pattern. An example of pattern drawing using the exposure head according to the invention will now be described with reference to FIGS. 17 through 19.

Figure 17:
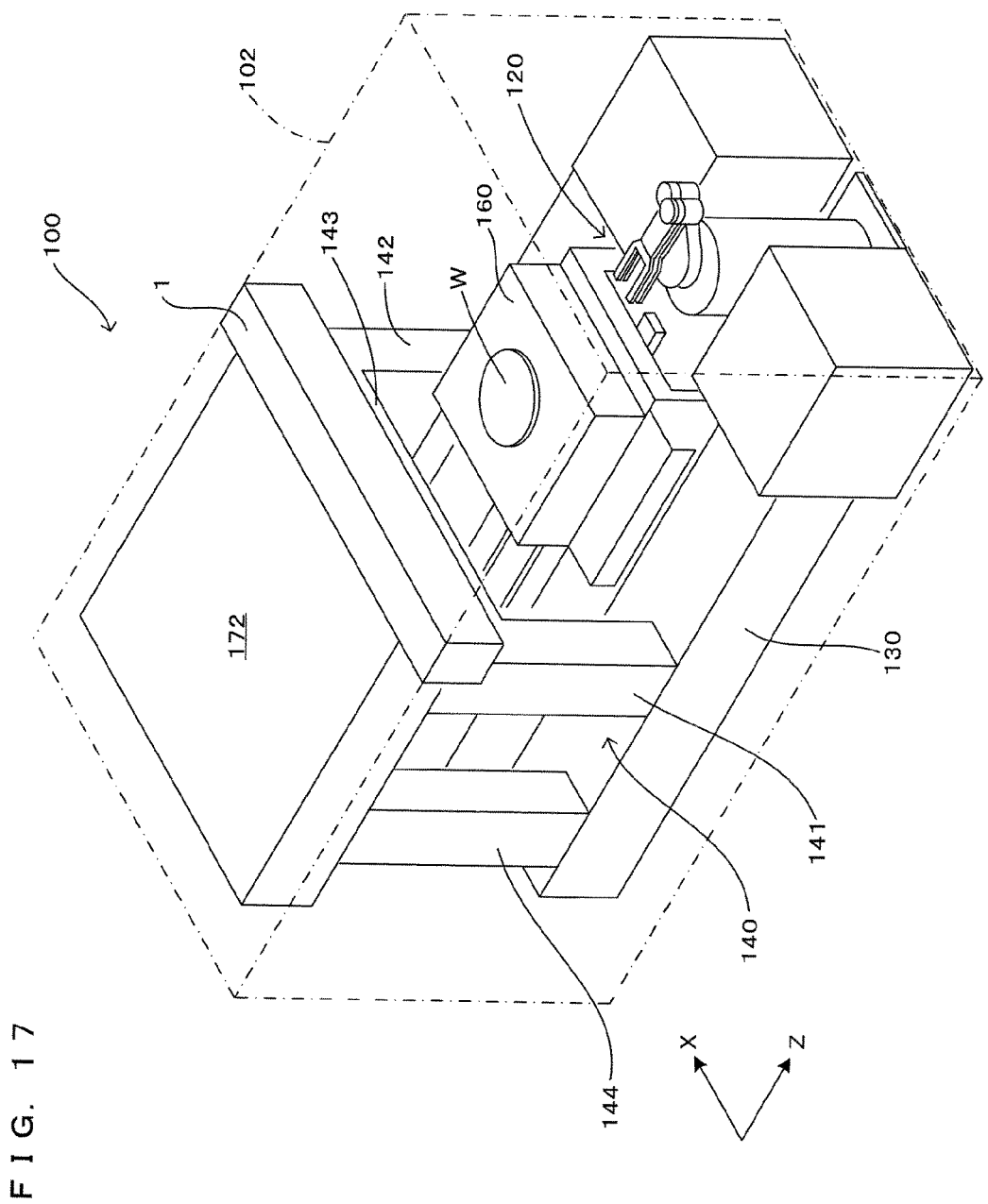
FIG. 17 is a perspective view which shows an example of a pattern drawing apparatus to which the invention is applicable.
Figure 18:
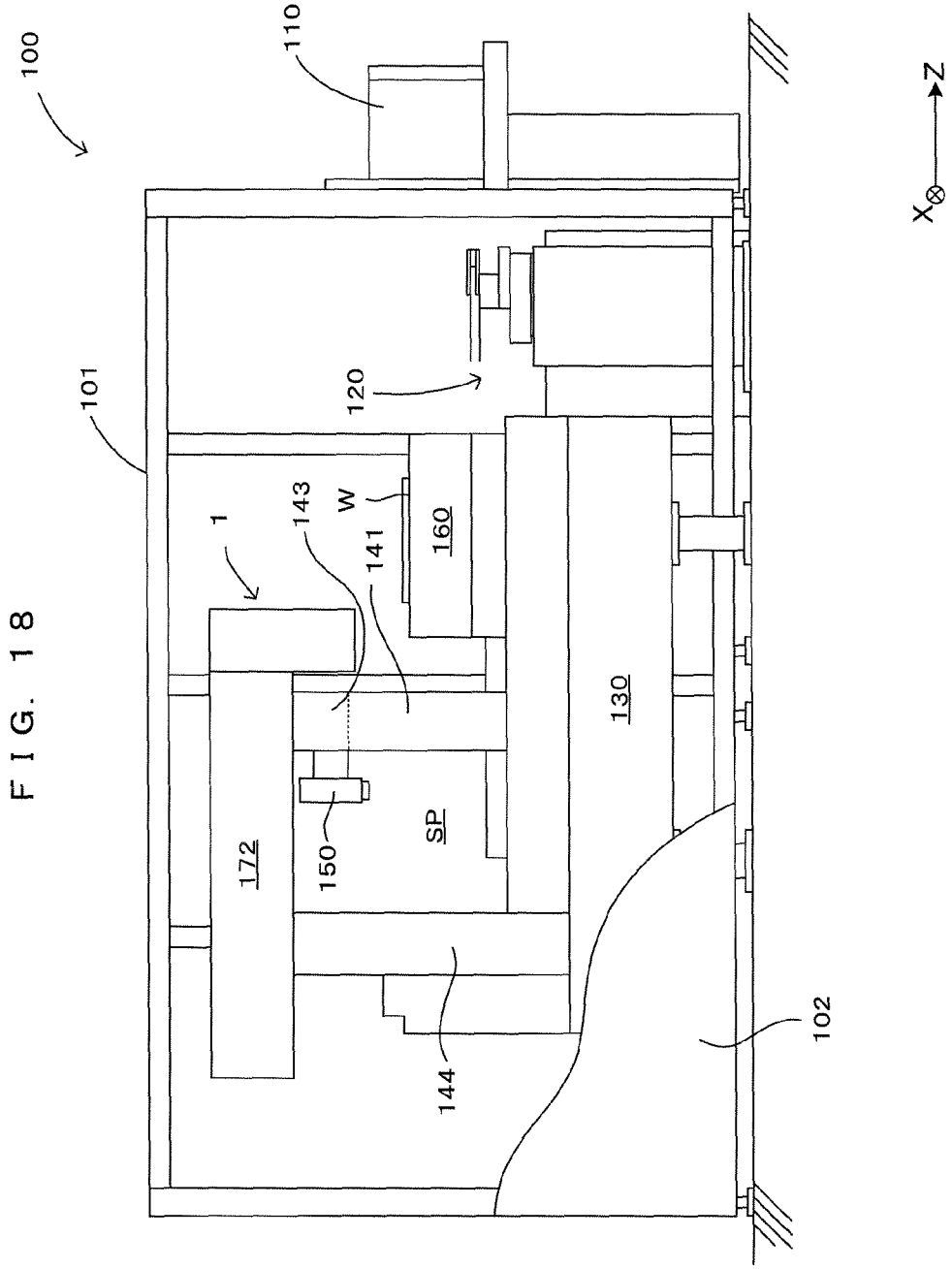
FIG. 18 is a side view of the example of the pattern drawing apparatus shown in FIG. 17.
Figure 19:
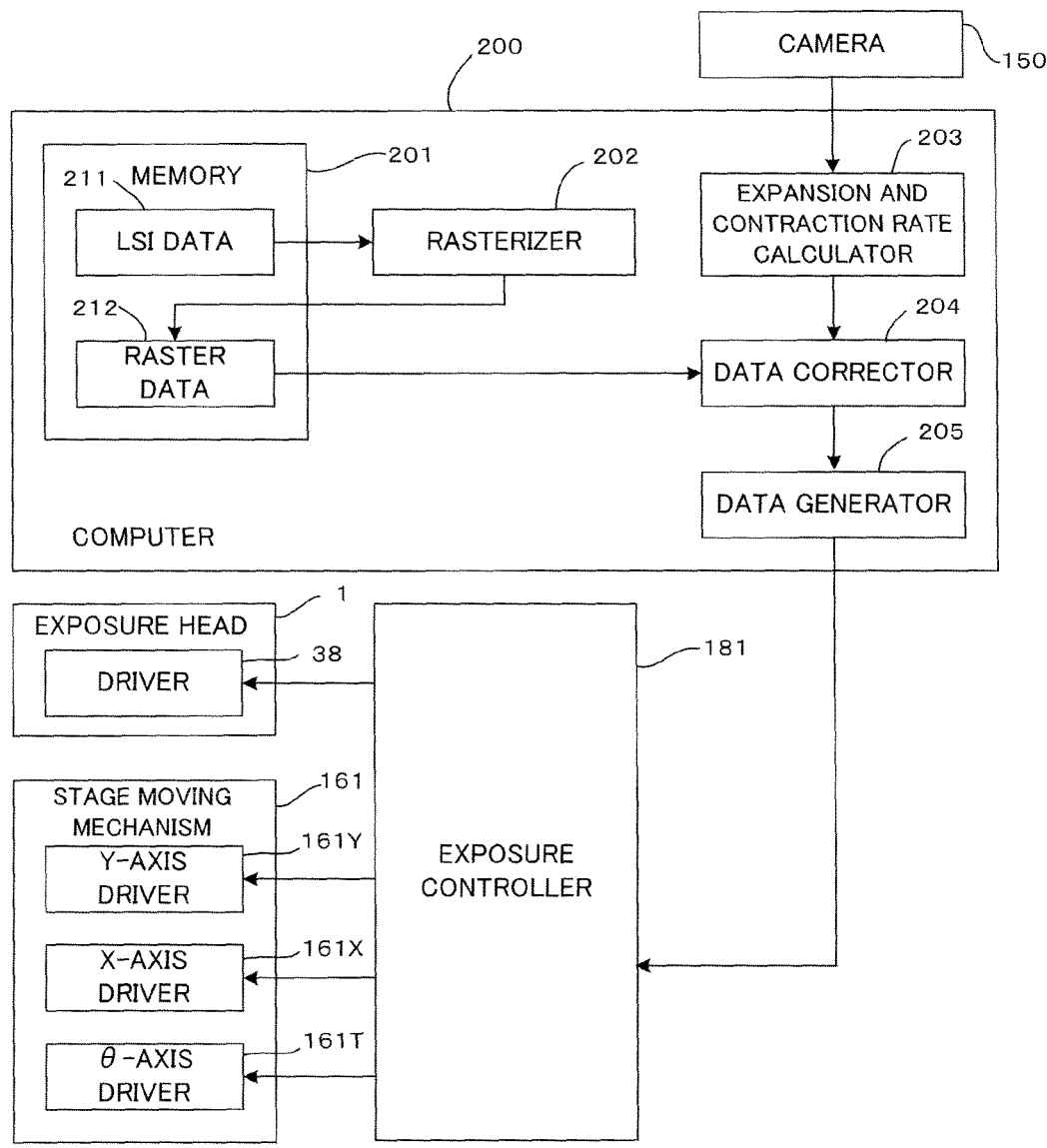
FIG. 19 is a block diagram which shows an electric structure of the example of the pattern drawing apparatus shown in FIG. 17.

FIG. 17 is a perspective view which shows an example of a pattern drawing apparatus to which the invention is applicable, FIG. 18 is a side view of the example of the pattern drawing apparatus shown in FIG. 17, and FIG. 19 is a block diagram which shows an electric structure of the example of the pattern drawing apparatus shown in FIG. 17. This pattern drawing apparatus 100 is an apparatus which draws a pattern by irradiating light upon the surface of the substrate W, such as a semiconductor substrate and a glass substrate, which has a photosensitive material on its surface.

In the pattern drawing apparatus 100, various units are disposed inside a main space which is defined by attaching a cover 102 to a main body frame 101, thereby forming a main body, and a substrate housing cassette 110 is disposed outside the main body (i.e., on the right-hand side to the main body according to this embodiment as shown in FIG. 18). The substrate housing cassette 110 houses an unprocessed substrate W to be exposed which is loaded into the main body by a transportation robot 120 which is disposed inside the main space. After exposure (pattern drawing) of the unprocessed substrate W, the transportation robot 120 unloads this substrate W from the main body and returns it back to the substrate housing cassette 110.

Inside the main body, as shown in FIGS. 17 and 18, the transportation robot 120 is disposed at the right-hand end of the main space which is enclosed by the cover 102. On the left-hand side to the transportation robot 120, a base holder 130 is disposed. A region on one side of the base holder 130 (which is a region on the right-hand side in FIGS. 17 and 18) serves as a substrate transfer region for transferring the substrate W to or from the transportation robot 120, whereas a region on the other side of the base holder 130 (which is a region on the left-hand side in FIGS. 17 and 18) serves as a pattern drawing region for drawing a pattern on the substrate W. On the base holder 130, a head supporter 140 is disposed at the boundary between the substrate transfer region and the pattern drawing region. Two legs 141 and 142 are disposed upright on the base holder 130 toward above, and a beam member 143 is disposed across the apexes of the legs 141 and 142 like a bridge. As shown in FIG. 18, a camera (imager) 150 is fixed to the pattern drawing region side surface of the beam member 143, which makes it possible to shoot the surface (a surface to be drawn or surface-to-be-exposed) of the substrate W which is held by a stage 160.

The stage 160 is moved on the base holder 130 in the direction X, the direction Y and the direction θ by a stage moving mechanism 161. In short, the stage moving mechanism 161 is obtained as an X-axis driver 161X (FIG. 19), a Y-axis driver 161Y (FIG. 19) and a θ-axis driver 161T (FIG. 19) are disposed one atop the other in this sequence on the top surface of the base holder 130, and moves in two-dimensional movements and positions the stage 160 within the horizontal plane. Further, the stage moving mechanism 161 rotates the stage 160 about the axis θ (vertical axis), adjusts the relative angle of the stage 160 to the exposure head 1 described later and sets the position of the stage 160. The stage moving mechanism 161 may be a conventional X-Y-θ-axis moving mechanism which is widely used.

On the pattern drawing region side to the head supporter 140, the exposure head 1 which uses the light modulator 3 according to the invention is fixedly secured to a box 172. The exposure head 1 is capable of irradiating light by a plurality channels simultaneously in the direction X which corresponds to "the sub scanning direction." That is, the exposure head 1 is capable of simultaneously irradiating, in the direction X, a plurality of light beams which have been modulated independently of each other. The exposure head 1 irradiate light upon the substrate W which moves together with the stage 160 in the direction Z which corresponds to "the main scanning direction" and a pattern is drawn on the substrate W.

There are two legs 144 which are disposed upright also at the opposite side to the substrate transfer side of the base holder 130 to the substrate transfer side (at the left-side edge in FIGS. 17 and 18). The box 172 housing the illumination optical system of the exposure head 1 is disposed as if to bridge the beam member 143 and the apexes of the two legs 144, and cover the pattern drawing region of the base holder 130 from above.

The pattern drawing apparatus 100 comprises a computer 200 to control the entire apparatus. The computer 200 is formed by a CPU (Central Processing Unit) and a memory 201, and is disposed inside a circuit rack (not shown) together with an exposure controller 181. The CPU in the computer 200 performs computation according to a predetermined program, thereby realizing a rasterizer 202, an expansion and contraction rate calculator 203, a data corrector 204 and a data generator 205. Data concerning a pattern corresponding to one LSI (Large Scale Integration) are data generated by an external CAD (Computer Aided Drawing) system or the like and made available in advance as LSI data 211 within the memory 201. As the respective units of the apparatus operate based upon drawing data Dd which the functional parts 202 through 205 have generated from the LSI data 211 as described below, the pattern of the LSI is drawn on the substrate W.

The rasterizer 202 divides an unit area represented by the LSI data 211 and rasterizes it, accordingly generates raster data 212 and saves the raster data 212 in the memory 201. After or in parallel to preparation of the raster data 212, the transportation robot 120 transports the unprocessed substrate W housed in the cassette 110 in the manner described above and puts the unprocessed substrate W on the stage 160.

Following this, the stage moving mechanism 161 moves the stage 160 to a location immediately below the camera 150 and positions alignment marks (reference marks) on the substrate W one by one to a shooting position for the camera 150, and the camera 150 then shoots the marks. An image signal outputted from the camera 150 is processed by an image processing circuit (not shown in FIG. 19) disposed within the circuit rack, and the locations of the alignment marks on the stage 160 are accurately identified. Based on thus obtained location information, the θ-axis driver 161T operates, very finely rotating the stage 160 about the vertical axis and aligning (matching) the stage 160 to the direction which is suitable to pattern drawing on the substrate W. This aligning may be performed after moving the stage 160 to a location immediately below the exposure head 1.

The expansion and contraction rate calculator 203 acquires the locations of the alignment marks on the substrate W calculated by the image processing circuit and the amount of correction by which the direction of the substrate W is corrected, and calculates the locations of the aligned alignment marks and the expansion and contraction rate of the substrate W (the expansion and contraction rate of the principal surface) in the main scanning direction Z and the sub scanning direction X. Meanwhile, the data corrector 204 acquires the raster data 212 and corrects the data in accordance with the expansion and contraction rate which represents the result of detection of expansion and contraction. For data correction here, the method according to Japanese Patent No. 4020248 may be used. After correction of the data for one divided area, the corrected raster data 212 are fed to the data generator 205. The data generator 205 generates the drawing data Dd corresponding to a post-change divided area, namely, data which correspond to one strip. The drawing data Dd are thus generated one after another in the computer 200 and outputted to the exposure controller 181.

The exposure controller 181, controlling the exposure head 1 and the stage moving mechanism 161 based upon the drawing data Dd, executes pattern drawing on the substrate W. To be more specific, the exposure controller 181 makes the stage moving mechanism 161 move the substrate W while operating the driver 38 of the exposure head 1 based upon the drawing data Dd, whereby each channel in the exposure head 1 realizes exposure of one strip. In this manner, the same number of strips as that of the channels are drawn on the substrate W. The exposure controller 181 then makes the stage moving mechanism 161 move the substrate W to the next drawing start position, and causes the exposure head 1 to execute exposure based upon the next drawing data Dd. This operation is repeated, thereby drawing all strips on the substrate W.

As drawing of all strips on the substrate W ends and drawing of the desired pattern on the substrate W completes, the stage 160 moves to a substrate transfer position (in the right-hand side region in FIGS. 17 and 18) while holding thus drawn substrate W, the transportation robot 120 then returns this substrate W back to the cassette 110 and takes out the next substrate W, and the series of similar processing to the one described above is repeated. Upon completion of pattern drawing on all substrates W housed in the cassette 110, the cassette 110 is unloaded from the pattern drawing apparatus 100.

As described above, since turning on and off of the respective channels is controlled using the light modulator 3 according to the invention, it is possible to clearly control ON/OFF of each pixel and hence to draw a high-precision pattern. In addition, it is possible to draw a pattern in a preferable manner even using light which does not have a favorable degree of parallelization, e.g., light containing rays which are at the angle of 0.1 degrees or larger with respect to the propagation direction Dp. It is further possible to perform pattern drawing at a relative low voltage of around 110 [V].

The invention is favorably applied to light modulators in general which modulate light passing through an electro-optical crystal substrate by a diffraction grating which is created in response to an applied voltage and to exposure heads in general which perform exposure with light modulated by such a light modulator.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A light modulator which modulates light propagating in a propagation direction, comprising:
a first electro-optic crystal substrate having a first periodic polarization reversal structure including a plurality of first and second polarization sections alternately arranged in a first period along a first arrangement direction orthogonal to the propagation direction to allow the light to propagate through the first periodic polarization reversal structure, directions of polarization developed in each first polarization section and each second polarization section in response to electric fields being opposite to each other;
a second electro-optic crystal substrate having a second periodic polarization reversal structure including a plurality of third and fourth polarization sections alternately arranged in a second period along a second arrangement direction orthogonal to the propagation direction to allow outgoing light from the first electro-optic crystal substrate to propagate through the second periodic polarization reversal structure, directions of polarization developed in each third polarization section and each fourth polarization section in response to electric fields being opposite to each other; and
a driver that applies a voltage upon the first electro-optic crystal substrate and the second electro-optic crystal substrate to create diffraction gratings inside the first periodic polarization reversal structure and the second periodic polarization reversal structure, thereby modulating the light,
wherein the first period and the second period are different from each other.

2. The light modulator according to claim 1, wherein one of the first period and the second period is twice or a larger integer multiple of the other.

3. The light modulator according to claim 1, wherein the driver gives rise to Raman-Nath diffraction by the diffraction grating created inside the first periodic polarization reversal structure and gives rise to Raman-Nath diffraction by the diffraction grating created inside the second periodic polarization reversal structure.

4. The light modulator according to claim 1, wherein the driver gives rise to Bragg diffraction by the diffraction grating created inside the first periodic polarization reversal structure and gives rise to Raman-Nath diffraction by the diffraction grating created inside the second periodic polarization reversal structure.

5. The light modulator according to claim 4, wherein the first period is shorter than the second period.

6. The light modulator according to claim 1, wherein the driver gives rise to Bragg diffraction by the diffraction grating created inside the first periodic polarization reversal structure and gives rise to Bragg diffraction by the diffraction grating created inside the second periodic polarization reversal structure.

7. The light modulator according to claim 1, further comprising a first electrode and a second electrode, wherein
each one of the first electro-optic crystal substrate and the second electro-optic crystal substrate is shaped like a flat plate whose principal surfaces are parallel to each other,
the first electrode is disposed extending on one principal surface of the first electro-optic crystal substrate and one principal surface of the second electro-optic crystal substrate,
the second electrode is disposed extending on the other principal surface of the first electro-optic crystal substrate and the other principal surface of the second electro-optic crystal substrate, and
the driver creates an electric potential difference between the first electrode and the second electrode and develops the diffraction gratings.

8. The light modulator according to claim 7, wherein in the orthogonal direction to the propagation direction, the width of the first electrode is wider than the width of the first polarization section and the second polarization section and the width of the third polarization section and the fourth polarization section.

9. The light modulator according to claim 7, further comprising
a holder which is adhered to the other principal surface of the first electro-optic crystal substrate and the other principal surface of the second electro-optic crystal substrate via the second electrode, and holds the first electro-optic crystal substrate and the second electro-optic crystal substrate.

10. The light modulator according to claim 1, further comprising a plurality of first electrodes and a second electrode, wherein
each one of the first electro-optic crystal substrate and the second electro-optic crystal substrate is shaped like a flat plate whose principal surfaces are parallel to each other,
the first electrodes are disposed on one principal surface of the first electro-optic crystal substrate and one principal surface of the second electro-optic crystal substrate such that the first electrodes extend parallel to the propagation direction and are separated from each other in the orthogonal direction to the propagation direction,
the second electrode is disposed extending on the other principal surface of the first electro-optic crystal substrate and the other principal surface of the second electro-optic crystal substrate, and
the driver creates an electric potential difference between each one of the first electrodes and the second electrode and develops the diffraction gratings between the first electrodes and the second electrode corresponding to every first electrode.

11. The light modulator according to claim 1, further comprising
a third electro-optic crystal substrate that has a third periodic polarization reversal structure and lets the light through the third periodic polarization reversal structure in which third polarization pairs, in each of which the directions of polarization developing in response to electric fields are opposite to each other, are arranged in a third period along a third arrangement direction which is orthogonal or inclined with respect to the propagation direction, wherein
the driver applies a voltage upon the third electro-optic crystal substrate to create a diffraction grating inside the third periodic polarization reversal structure, thereby modulating the light, and
at least one of a first condition and a second condition is satisfied, the first condition being that the third period is different from the second period, the second condition being that the third arrangement direction is different from the second arrangement direction.

12. The light modulator according to claim 11, wherein the first condition is satisfied, and
the first period, the second period and the third period are integer multiple of the shortest one of the first period, the second period and the third period.

13. The light modulator according to claim 12, wherein the first period, the second period and the third period are integer multiple of each other.

14. An exposure head, comprising:
an illumination optical system which irradiates light from a light source in a propagation direction;
a light modulator which modulates the light irradiated from the illumination optical system; and
a projection optical system which projects the modulated light from the modulator upon an area-to-be-exposed, wherein the light modulator comprises:
a first electro-optic crystal substrate having a first periodic polarization reversal structure including a plurality of first and second polarization sections alternately arranged in a first period along a first arrangement direction orthogonal to the propagation direction to allow the light to propagate through the first periodic polarization reversal structure, directions of polarization developed in each first polarization section and each second polarization section in response to electric fields being opposite to each other;
a second electro-optic crystal substrate having a second periodic polarization reversal structure including a plurality of third and fourth polarization sections alternately arranged in a second period along a second arrangement direction orthogonal to the propagation direction to allow outgoing light from the first electro-optic crystal substrate to propagate through the second periodic polarization reversal structure, directions of polarization developed in each third polarization section and each fourth polarization section in response to electric fields being opposite to each other; and
a driver that applies a voltage upon the first electro-optic crystal substrate and the second electro-optic crystal substrate to create diffraction gratings inside the first periodic polarization reversal structure and the second periodic polarization reversal structure, thereby modulating the light, wherein the first period and the second period are different from each other.

15. The exposure head according to claim 14, wherein the light emitted from the light source contains a ray which is at the angle of 0.1 degree or larger with respect to the propagation direction.

16. The exposure head according to claim 14, further comprising a plurality of first electrodes and a second electrode wherein each one of the first electro-optic crystal substrate and the second electro-optic crystal substrate is shaped like a flat plate whose principal surfaces are parallel to each other, the first electrodes are disposed on one principal surface of the first electro-optic crystal substrate and one principal surface of the second electro-optic crystal substrate such that the first electrodes extend parallel to the propagation direction and are separated from each other in the orthogonal direction to the propagation direction, the second electrode is disposed extending on the other principal surface of the first electro-optic crystal substrate and the other principal surface of the second electro-optic crystal substrate, and the driver creates an electric potential difference between each one of the first electrodes and the second electrode and develops the diffraction gratings between the first electrode and the second electrode corresponding to every first electrode.

17. The exposure head according to claim 16, wherein the light source is a surface emitting light source.

18. The exposure head according to claim 16, wherein the light source is a light source in which a plurality of point light sources are arranged.

19. The exposure head according to claim 18, wherein the light source is a laser array in which lasers are arranged one-dimensionally.

* * * * *